United States Patent [19]
Ehret et al.

[11] Patent Number: 5,582,956
[45] Date of Patent: Dec. 10, 1996

[54] PROCESS FOR FIXING AN IMAGE, AND MEDIUM FOR USE THEREIN

[75] Inventors: Anne Ehret, Malden; John L. Marshall, Somerville; Rita S. S. Baker, Brookline; Larry C. Takiff; Stephen J. Telfer, both of Arlington; John C. Warner, Norwood, all of Mass.

[73] Assignee: Polaroid Corporation, Cambridge, Mass.

[21] Appl. No.: 430,421

[22] Filed: Apr. 28, 1995

Related U.S. Application Data

[63] Continuation-in-part of Ser. No. 232,757, Apr. 25, 1994.
[51] Int. Cl.$^6$ ................................. G03C 1/73; G03C 5/00
[52] U.S. Cl. ........................ 430/337; 430/332; 430/335; 430/336; 430/338
[58] Field of Search ................................ 430/337, 338, 430/332, 336, 335, 495.1, 496

[56] References Cited

U.S. PATENT DOCUMENTS

| | | | |
|---|---|---|---|
| 3,617,270 | 11/1971 | Kampfer | 430/62 |
| 3,623,866 | 11/1971 | Averbach | 430/337 |
| 3,915,706 | 10/1975 | Limburg et al. | 430/290 |
| 3,932,514 | 1/1976 | Thelen et al. | 260/586 P |
| 4,092,146 | 5/1978 | Fischer et al. | 71/70 |
| 4,159,387 | 6/1979 | Bellus | 560/185 |
| 4,251,619 | 2/1981 | Kurita | 430/292 |
| 4,306,014 | 12/1981 | Kunikane et al. | 430/338 |
| 4,345,017 | 8/1982 | Cournoyer et al. | 430/221 |
| 4,508,811 | 4/1985 | Gravesteijn et al. | 430/270.1 |
| 4,602,263 | 7/1986 | Borrer et al. | 346/201 |
| 4,659,649 | 4/1987 | Dickinson et al. | 430/280 |
| 4,701,402 | 10/1987 | Patel et al. | 430/332 |
| 4,720,449 | 1/1988 | Borrer et al. | 430/338 |
| 4,826,976 | 5/1989 | Borrer et al. | 544/58.4 |
| 4,857,437 | 8/1989 | Banks et al. | 430/270.1 |
| 4,916,046 | 4/1990 | Doessel | 430/281.1 |
| 4,992,571 | 2/1991 | Fukuyama et al. | 566/64 |
| 5,037,575 | 8/1991 | Miura et al. | 430/70 |
| 5,055,376 | 10/1991 | Saeva | 430/270.1 |
| 5,084,371 | 1/1992 | Schwalm et al. | 430/270.1 |
| 5,102,771 | 4/1992 | Vogel et al. | 430/270 |
| 5,141,969 | 8/1992 | Saeva et al. | 430/270 |
| 5,219,703 | 6/1993 | Bugner et al. | 430/200 |
| 5,227,499 | 7/1993 | Lee et al. | 549/404 |
| 5,278,031 | 1/1994 | Boggs et al. | 430/348 |
| 5,286,612 | 2/1994 | Telfer | 430/335 |
| 5,334,489 | 8/1994 | Grasshoff et al. | 430/335 |
| 5,354,873 | 10/1994 | Allen et al. | 549/404 |
| 5,395,736 | 3/1995 | Grasshoff et al. | 430/270 |
| 5,405,976 | 4/1995 | Telfer et al. | 549/404 |

FOREIGN PATENT DOCUMENTS

| | | |
|---|---|---|
| 537975 | 4/1993 | European Pat. Off. . |
| WO92/11581 | 7/1992 | WIPO . |

OTHER PUBLICATIONS

Beringer, F. M. et al., J. Am. Chem. Soc., 60, 141 (1956).
Berry et al., Chemically Amplified Resists for I–line and G–line Applications, SPIE 1262, 575 (1990).
Bi, Y. et al., J. Photochem. Photobiol. A: Chem, 74, 221 (1993).
Bou et al., Tetrahedron Letters, 23(3), 361 (1982).
Cohen S. and Cohen, S. G., J. Am. Chem. Soc., 88, 1533 (1966).
Crivello et al., J. Polym. Sci., Polym. Chem. Ed., 16, 2441 (1978).
Crivello et al., J. Polym. Sci., Polym. Chem. Ed., 19,539 (1981).
Crivello et al., J. Polym. Sci., Chem. Ed., 21, 1097 (1983).
Crivello et al., J. Polym. Sci., Polym Chem. Ed., 21, 97 (1983).
Dehmlow et al., Chem. Ber. 113(1), 1–8 (1979).
Dehmlow et al., Chem. Ber. 121(3), 569–71 (1988).
Fouassier et al., J. Imag. Sci. Tech., 37(2), 208 (1993).
Hammerich and Parker, Acta Chemica Scandinavica, B 36, 63–64 (1982).
Islam, N. et al., Tetrahedron 43, 959–970 (1987).
Ito et al., Polymer Sci. Eng., 23(18), 1012 (1983).
Krohke, Synthesis, 1976, 1.
Mitchell, R. D. et al., J. Imag. Sci., 30(5), 215 (1986).
Lockhart, T. P., J. Am. Chem. Soc., 105(7), 1940 (1983).
Ohe, Y. et al., J. Imag. Sci. Tech., 37(3), 250 (1993).
Pappas, S. P. et al., Progress in Organic coatings, 13, 35 (1964).
Pericas et al., Tetrahedron Letters, (1977), 4437–38.
Ptitsyna et al., Zh. Organ Khim., 6(7), 1353 (1970) (English translation only).
Reichmanis et al., Chemical Amplification Mechanism for Microlithography, Chem. Mater., 3(3), 394 (1991).
Wallraff, G. M. et al., J. Imag. Sci. Tech., 36(5), 468 (1992).
Weiss, J. Am. Chem. Soc., 74, 200 (1952).

*Primary Examiner*—John A. McPherson
*Attorney, Agent, or Firm*—David J. Cole

[57] ABSTRACT

A process for producing and fixing an image uses an imaging medium comprising an acid-generating layer or phase comprising a mixture of a superacid precursor, a sensitizer and a secondary acid generator, and a color-change layer comprising an image dye. The sensitizer can absorb radiation of a sensitizer wavelength which does not, in the absence of the sensitizer, cause decomposition of the superacid precursor to form the corresponding superacid. The secondary acid generator is capable of acid-catalyzed thermal decomposition by the first acid to form a secondary acid, and the image dye undergoes a color change upon contact with the secondary acid. The medium is imagewise exposed to radiation of the sensitizer wavelength, thereby causing the sensitizer, in exposed areas, to decompose superacid precursor with formation of the fist acid. The medium is then heated to cause, in the exposed areas, acid-catalyzed thermal decomposition of the secondary acid generator and formation of the secondary acid. The components of the acid-generating and color-change layers or phases are mixed so that in exposed areas, the secondary acid causes the image dye to change color. At least the non-exposed areas, there is reacted with the superacid precursor a reactive material which irreversibly destroys the superacid precursor, thus fixing the image.

56 Claims, 4 Drawing Sheets

PROCESS FOR FIXING AN IMAGE, AND MEDIUM FOR USE THEREIN

REFERENCE TO RELATED PATENTS AND APPLICATIONS

This application is a continuation-in-part of our copending application Ser. No. 08/232,757, filed Apr. 24, 1994.

U.S. Pat. Nos. 5,334,489 and 5,395,736, and the corresponding International Application No. PCT/US93/10224 (Publication No. WO94/10607), all describe imaging processes which comprise imagewise exposing a superacid precursor to actinic radiation effective to generate superacid from the superacid precursor; heating the superacid while the superacid is admixed with a secondary acid generator capable of undergoing thermal decomposition to produce a secondary acid, the thermal decomposition of the secondary acid generator being catalyzed by the superacid, the heating being continued for a temperature and time sufficient to cause the superacid to produce the secondary acid from the secondary acid generator; and during or subsequent to the heating, contacting the secondary acid with an acid-sensitive material which changes color in the presence of the secondary acid. (For convenience, the type of process disclosed in these patents and this International application will hereinafter be called the '489 process.)

U.S. application Ser. No. 08/141,852, filed Oct. 22, 1993 (now U.S. Pat. No. 5,453,345), and its parent, U.S. Pat. No. 5,286,612 (both assigned to the same assignee as the present application) describe an imaging process using an imaging medium comprising an acid-generating layer or phase and a color-change layer or phase. (For convenience, the type of process disclosed in this patent and applications will hereinafter be called the '612 process.) The acid-generating layer or phase comprises a mixture of a superacid precursor, a sensitizing dye and a secondary acid generator. The sensitizing dye is capable of absorbing radiation of a first wavelength which does not, in the absence of this dye, cause decomposition of the superacid precursor to form the corresponding superacid. The superacid precursor is capable of being decomposed, by radiation of a second wavelength shorter than the first wavelength, to form superacid. The secondary acid generator is capable of acid-catalyzed thermal decomposition by unbuffered superacid to form a secondary acid. The color-change layer or phase comprises an image dye which undergoes a change in its absorption of radiation upon contact with the secondary acid. This medium is imaged by first imagewise irradiating it with radiation of the first wavelength, which causes decomposition of part of the superacid precursor, without formation of unbuffered superacid but with formation of a protonated product derived from the dye. Thereafter, the whole medium is irradiated with radiation of the second wavelength, with decomposition of part of the remaining superacid and formation of unbuffered superacid only in areas of the medium exposed to the first, imagewise irradiation. The medium is then heated; in areas exposed to radiation of the first wavelength (hereinafter called the "exposed areas"), the unbuffered superacid causes acid-catalyzed decomposition of the secondary acid generator, thereby causing the formation of a molar amount of secondary acid much larger than the molar amount of unbuffered superacid present before the heating. In the non-exposed areas, however, since no unbuffered superacid is present, no significant generation of secondary acid takes place during the heating. Thereafter, the medium is further heated (in practice the two heating steps can be combined) to cause the components present in the two layers or phases to mix, so that, in exposed areas, the secondary acid brings about the absorption change in the image dye, thereby forming an image. Thus, the imaging medium is a single sheet which develops its image without any need for treatment with a developing composition and without requiring any waste material to be peeled from the medium to produce the final image.

(The term "unbuffered superacid" is used herein to refer to superacid which is not buffered by the sensitizer, and which thus provides an acidic species stronger than that provided by buffered superacid, that is to say superacid buffered by the sensitizer. Because of the extreme acidity of superacids and their consequent tendency to protonate even species which are not normally regarded as basic, it is possible, and indeed likely, that "unbuffered superacid" will in fact be present as a species buffered by some component of the imaging medium less basic than the sensitizer. However, such buffering by other species may be ignored for present purposes, so long as superacid is present as an acidic species stronger than that provided by superacid buffered by the sensitizer.)

U.S. application Ser. No. 08/232,725, filed Apr. 25, 1994 (now U.S. Pat. No. 5,441,850), and its continuation-in-part application Ser. No. 08/430,420 of even date herewith and assigned to the same assignee as the present application, describe a modified form of the '489 process (hereinafter called the "indicator sensitizing dye process") using a sensitizing dye having a first form and a second form, the first form having substantially greater substantial absorption in a first wavelength range than the second form; in one form of this process, the first form is a protonated form, while the second form is an unprotonated form. While at least part of the sensitizing dye is in its first form, the medium is imagewise exposed to actinic radiation in the first wavelength range, thereby causing, in the exposed areas of the acid-generating layer or phase, the sensitizing dye to decompose at least part of the superacid precursor, with formation of unbuffered superacid. Acid-catalyzed thermal decomposition of the secondary acid generator and formation of the secondary acid, followed by admixture of the two layers or phases of the medium, are then effected as in the '489 process. Finally, a reagent is introduced into the non-exposed areas of the medium to convert the sensitizing dye to its second form. This indicator sensitizing dye process has the advantage that the imagewise exposure can be carried out in the same wavelength range as that in which the image is to be viewed.

The entire disclosures of the aforementioned patents and applications are herein incorporated by reference.

BACKGROUND OF THE INVENTION

This invention relates to a process for fixing an image, and to an imaging medium for use in this process. More specifically, this invention relates to a process capable of fixing images produced by the aforementioned '489, '612 and indicator sensitizing dye processes, although the fixing process of the invention may also be useful for fixing images produced by other processes but having unchanged superacid precursor present in the non-exposed areas of the final image.

As discussed in the aforementioned applications, some conventional non-silver halide photosensitive compositions, for example photoresists, contain molecules which are inherently photosensitive, so that absorption of a single photon brings about decomposition of only the single molecule which absorbs the photon. However, a dramatic increase in the sensitivity of such photosensitive compositions can be achieved if the photosensitive molecule initiates a secondary reaction which is not radiation-dependent and which effects conversion of a plurality of molecules for each photon absorbed. For example, photoresist systems are known in which the primary photochemical reaction produces an acid, and this acid is employed to eliminate acid-labile groups in a secondary, radiation-independent reaction.

U.S. Pat. No. 4,916,046 describes a positive radiation-sensitive mixture using a monomeric silylenol ether, and a recording medium produced therefrom. This patent also contains an extensive discussion of radiation-sensitive compositions which form or eliminate an acid on irradiation. According to this patent, such radiation-sensitive compositions include diazonium, phosphonium, sulfonium and iodonium salts, generally employed in the form of their organic solvent-soluble salts, usually as deposition products with complex acids such as tetrafluoroboric acid, hexafluorophosphoric acid, hexafluoroantimonic acid and hexafluoroarsenic acid; halogen compounds, in particular triazine derivatives; oxazoles, oxadiazoles, thiazoles or 2-pyrones which contain trichloromethyl or tribromomethyl groups; aromatic compounds which contain ring-bound halogen, preferably bromine; a combination of a thiazole with 2-benzoylmethylenenaphthol; a mixture of a trihalomethyl compound with N-phenylacridone; α-halocarboxamides; and tribromomethyl phenyl sulfones.

The aforementioned phosphonium, sulfonium and iodonium salts are superacid precursors which, upon exposure to ultraviolet radiation, decompose to produce superacids, that is to say acids with a $pK_a$ less than about 0. Other materials decompose to produce superacids in a similar manner.

The applications and patents mentioned in the "References to Related Applications and Patents" section hereof describe processes in which imagewise breakdown of a superacid precursor to produce unbuffered superacid is effected using imagewise exposure of the medium to radiation of a wavelength which, in the absence of the sensitizer, will not cause breakdown of the superacid precursor. The imagewise distribution of unbuffered superacid thus produced is used to catalyze the thermal breakdown of the secondary acid generator, thus producing, in the exposed areas of the medium, a molar quantity of the secondary acid larger than the molar quantity of unbuffered superacid present in these areas. The secondary acid is used to bring about the absorption change (hereinafter sometimes called "color change," with the understanding that the "color" may not be in the wavelength range visible to the human eye) of the indicator dye, thus forming an image.

At least the non-exposed areas of the image thus produced still contain unchanged superacid precursor, and this superacid precursor is still susceptible to decomposition by electromagnetic radiation with formation of acid. Such post-imaging generation of acid will also occur in the exposed areas if, as is usually the case, unchanged superacid precursor is also present in these areas. Unfortunately, in practice it is usually necessary to incorporate into this type of imaging medium a molar quantity of superacid precursor substantially larger than the molar quantity of superacid required for imaging, since the quantum yield for the generation of superacid during the imagewise exposure (and hence the overall sensitivity of the imaging process) is dependent upon the concentration of superacid precursor present, and a substantial excess of superacid precursor is needed for optimum quantum yield. In fact, the optimum molar quantity of superacid precursor may be a substantial fraction of the molar quantity of secondary acid generated by complete thermal breakdown of the secondary acid generator. For example, the aforementioned U.S. Pat. No. 5,286,612 describes a '612 imaging medium containing 1 mole of sensitizing dye, 5 moles of superacid precursor and a quantity of secondary acid generator sufficient to yield 10 moles of secondary acid. Accordingly, most images produced using media of the '612 or indicator sensitizing dye types are susceptible to post-imaging changes due to unwanted superacid precursor decomposition and acid generation in non-exposed areas.

The present invention relates to a process in which the superacid precursor remaining in at least the unexposed areas of the images produced by the methods discussed above is destroyed, thus fixing the image.

SUMMARY OF THE INVENTION

This invention provides a process for producing and fixing an image. This process uses an imaging medium comprising an acid-generating layer or phase comprising a mixture of a superacid precursor, a sensitizer and a secondary acid generator, and a color-change layer or phase comprising an image dye. The sensitizer is capable of absorbing actinic radiation of a sensitizer wavelength which does not, in the absence of the sensitizer, cause decomposition of the superacid precursor to form a first acid. The secondary acid generator is capable of acid-catalyzed thermal decomposition by the first acid to form a secondary acid, and the image dye undergoes a change in its absorption of radiation upon contact with the secondary acid. In the present process, the medium is imagewise exposed to actinic radiation of the sensitizer wavelength, thereby causing, in the exposed areas of the acid-generating layer or phase, the sensitizer to decompose at least part of the superacid precursor, and this imagewise exposure leads to imagewise formation of first acid in the acid-generating layer. Thereafter, the medium is heated to cause, in the exposed areas of the acid-generating layer or phase, acid-catalyzed thermal decomposition of the secondary acid generator and formation of the secondary acid. The components of the acid-generating and color-change layers or phases are mixed, thereby causing, in the exposed areas of the medium, the secondary acid to bring about the change in absorption of the image dye and thereby form the image. Finally, in at least the non-exposed areas of the medium, the superacid precursor is reacted with a reactive material which irreversibly destroys the superacid precursor, thereby fixing the image.

In theory, no chemical reaction is thermodynamically completely irreversible; however, as any chemist is aware, there are many reactions where the equilibrium lies so far to one side that no detectable trace of the other supposed components of the equilibrium mixture are present, and the term "irreversible" is used herein to mean such reactions which are for practical purposes irreversible.

Depending upon the type of reaction used to bring about the decomposition of the superacid precursor, acid may or may not be generated during this decomposition. If acid is generated during the decomposition, it is necessary to prevent this acid from bringing about a change in absorption of the image dye, since such a change will increase the minimum optical density ($D_{min}$) of the image and hence (at the least) reduce the contrast and quality of the image. Accordingly, if the fixing reaction does result in production of acid, sufficient base should be introduced into at least the non-exposed areas of the image to neutralize the acid produced by decomposition of the superacid precursor, thus preventing this acid from affecting the optical density of the non-exposed areas. For reasons explained below, introduction of a sufficient amount of base into all areas of the image can be effected without significantly affecting the maximum optical density ($D_{max}$) in the exposed areas of the image.

This invention also provides an imaging medium comprising an acid-generating layer or phase comprising a mixture of a superacid precursor, a sensitizer and a secondary acid generator, and a color-change layer comprising an image dye. In this medium, the sensitizer is capable of absorbing actinic radiation of a sensitizer wavelength which does not, in the absence of the sensitizer, cause decomposition of the superacid precursor to form a first acid, the secondary acid generator is capable of acid-catalyzed thermal decomposition by the first acid to form a secondary acid, and the image dye undergoes a change in its absorption of radiation upon contact with the secondary acid. The imaging medium further comprises a reactive compound capable of bringing about the irreversible decomposition of the superacid precursor.

Finally, this invention provides a process for fixing an image in an imaging medium, the imaging medium having exposed areas comprising an image dye at least part of which is in protonated form, an acid, and a sensitizer, and non-exposed areas comprising the image dye in unprotonated form, the sensitizer, a superacid precursor and a secondary acid generator. In this imaging medium, the sensitizer is capable of absorbing actinic radiation of a sensitizer wavelength which does not, in the absence of the sensitizer, cause decomposition of the superacid precursor to form a first acid, and the secondary acid generator being capable of acid-catalyzed thermal decomposition by the first acid to form a secondary acid. The fixing process comprises reacting, with the superacid precursor, in at least the non-exposed areas of the medium, a reactive material which irreversibly destroys the superacid precursor, thereby fixing the image.

It should be noted that, in some processes of the present invention, such as the '612 process described above, more than the imagewise exposure of the imaging medium to the radiation of the first wavelength is needed to produce the imagewise distribution of first acid in the medium.

DETAILED DESCRIPTION OF THE INVENTION

As already described, in the process of the present invention, a reactive material, capable of irreversibly destroying the superacid precursor, is used to bring about the decomposition of the superacid precursor remaining in at least the non-exposed areas of the image, thus fixing the image and rendering it no longer susceptible to changes caused by radiation which could otherwise decompose the superacid precursor.

There are three preferred types of reactive materials for use in the present process:

(a) Materials capable of effecting a nucleophilic addition/elimination reaction with the superacid precursor, via either a free radical or $S_NAr$ reaction; this variant of the present process will hereinafter be called the "simple nucleophile" process;

(b) Materials capable of stoichiometric reduction of the superacid precursor; this variant of the present process will hereinafter be called the "reduction" process; and (c) A nucleophile in combination with an oxidation/reduction catalysts; this variant of the present process will hereinafter be called the "nucleophile/redox catalyst" process.

These three preferred variants of the present process will now be discussed separately, and thereafter, in the section headed "General Considerations", considerations common to all the variants will be described.

Simple Nucleophile Process

Thermal reactions of superacid precursors salts with nucleophiles are known; when the superacid precursor is a diaryliodonium salt, as in the preferred forms of the '489, '612and indicator sensitizing dye imaging processes described above, the simple nucleophile process will typically lead to cleavage of one of the aryl-iodine bonds with formation of an aryl iodide and an adduct of the nucleophile with the second aryl ring (i.e., a product in which an aryl compound is substituted with a residue of a nucleophile derived from the reactive material). When the nucleophile is negatively charged, such reactions normally do not lead to the formation of acid from the superacid precursor, so no additional base is required to neutralize such acid.

Figure 1:
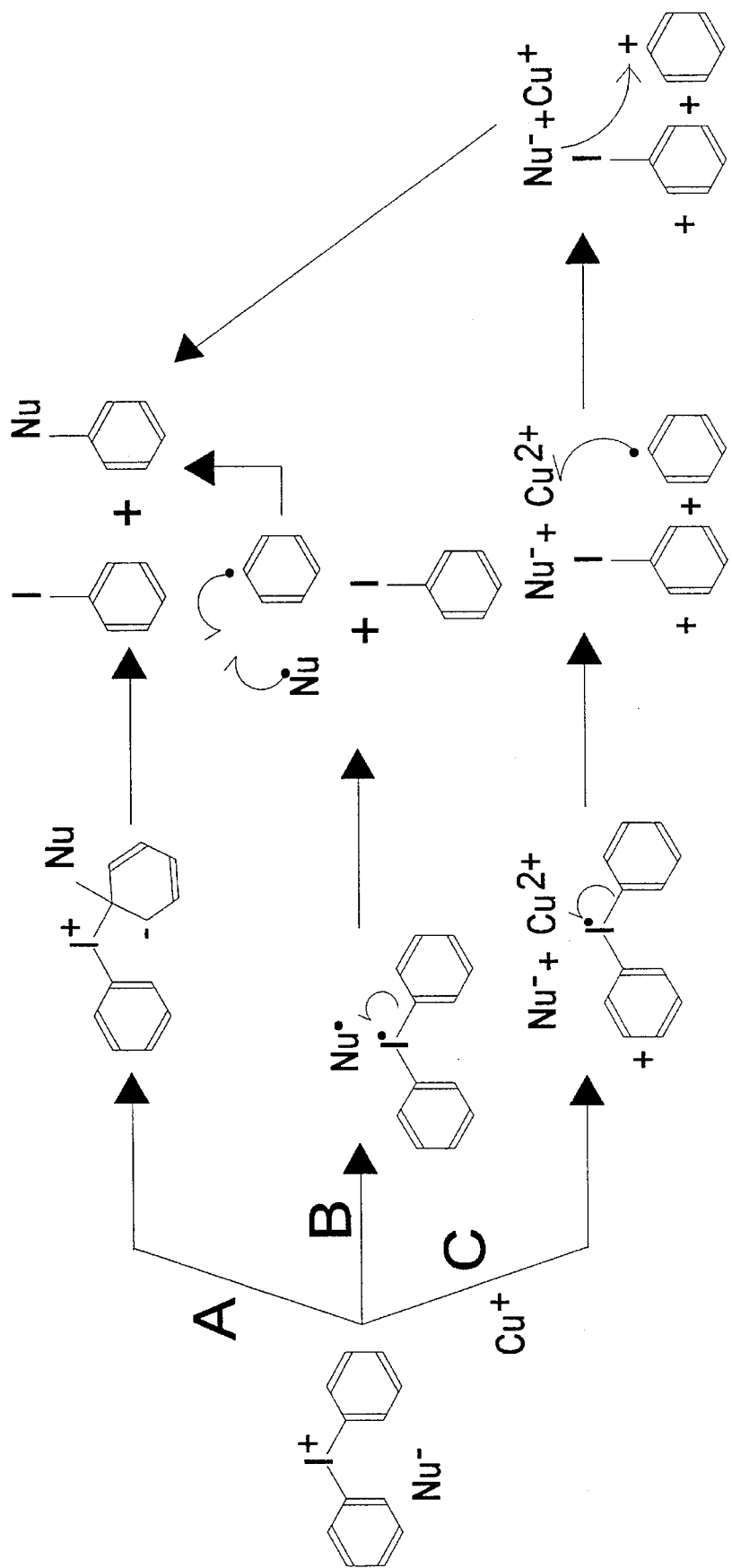
FIG. 1 shows the reactions leading to destruction of the superacid precursor in certain preferred processes of the present invention.

Two mechanisms of uncatalyzed addition of nucleophiles to diaryl iodonium salts are shown in FIG. 1. The first mechanism, shown at A, is an ionic addition/elimination reaction of the $S_NAr$ type. The second mechanism, which may take place when the nucleophile is capable of being oxidized, is shown at B and is a free-radical coupling mechanism.

Preferred reactive materials for use in the simple nucleophile process are salts of monovalent metals (the term "monovalent metal" is used herein to include ammonium and substituted ammonium groups), desirably such salts in which the cation is potassium or cesium. As illustrated in the Examples below, for acetates, the order of effectiveness of various cations in fixing has been found to be:

ammonium~lithium<sodium<<potassium<cesium.

The efficiency of fixation depends also on the nucleophilicity of the anion and its compatibility with the medium in which the fixation is being effected, which is typically an organic polymer, for example polystyrene. Preferred salts are those having fluoride, carboxylate, iodide, hydroxide, phenoxide or benzoate anions. As illustrated in the Examples below, the times of heating required for fixation (which is of course inversely proportional to the efficiency of fixation), for seven representative cesium salts, are in the approximate order:

chloride>>>fluoride>acetate>iodide>hydroxide~phenoxide>benzoate.

The choice of nucleophilic reactive materials for use in the simple nucleophile process varies depending upon whether the image to be fixed is a binary image (in which any given pixel of the image is either colored or uncolored) or a continuous tone image (in which any given pixel may display a range of gradations of color). When the image is a binary image, the nucleophile provided by the reactive material can be more basic than the image dye or the anion of the secondary acid. On the other hand, when the image is a continuous tone image, the nucleophile provided by the reactive material should be less basic than the image dye or the anion of the secondary acid. To see why these basicity relationships are important, consider an imaging system of the indicator sensitizing dye type using (per unit area of the system) 1 mole of diphenyliodonium hexafluoroantimonate as the superacid precursor, and 5 moles of an oxalate ester as the secondary acid generator, both in the acid-generating layer, and 6 moles of an indicator sensitizing dye and 1 mole of an acetate or iodide salt as the nucleophilic fixing reagent in the color-change layer. The order of acidity of the conjugate acids of the various components is assumed to be:

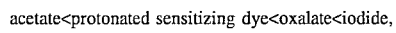

acetate<protonated sensitizing dye<oxalate<iodide, and for purposes of illustration, it is assumed that each mole of unbuffered superacid generated during the imagewise exposure generates 25 moles of secondary acid during the heating step. For ease of comprehension, it is assumed that only three gray scale levels are present in the image, namely $D_{min}$ (in which no superacid precursor is decomposed during the imagewise exposure), $(D_{max})/2$ (in which 0.1 mole of superacid precursor is decomposed during the imagewise exposure) and $D_{max}$ (in which 0.2 mole of superacid precursor is decomposed during the imagewise exposure). At the end of the first heating step, when superacid-catalyzed decomposition of the secondary acid generator and generation of the secondary acid has been completed, but no mixing of the acid-generating and color-change layers has occurred, the amounts of the various components present in the acid-generating layer at the three gray-scale levels will be as follows (for a more detailed explanation of how the following values are derived, see the explanation of Table 1 in the aforementioned copending application Ser. No. 08/232,725, now U.S. Pat. No. 5,441,850):

|  | $D_{min}$ | Exposure Level $(_{max})/2$ | $D_{max}$ |
| --- | --- | --- | --- |
| Iodonium salt | 1 | 0.9 | 0.8 |
| $HSbF_6$ | 0 | 0.1 | 0.2 |
| $SbF_6$ | 1 | 0.9 | 0.8 |
| Phenyl iodide | 0 | 0.1 | 0.2 |
| Oxalate secondary acid generator | 5 | 2.5 | 0 |
| Oxalic acid | 0 | 2.5 | 5 |

The acid-generating and color-change layers are then mixed by heating. For the sake of illustration, consider a hypothetical situation (probably impossible in practice) in which all the image dye diffuses into the acid-generating layer before any of the fixing reagent diffuses into the same layer. After all the image dye has diffused in, the composition of the various parts of the acid-generating layer will be as follows:

|  | $D_{min}$ | Exposure Level $(D_{max})/2$ | $D_{max}$ |
| --- | --- | --- | --- |
| Iodonium salt | 1 | 0.9 | 0.8 |
| $SbF_6^-$ | 1 | 1 | 1 |
| Phenyl iodide | 0 | 0.1 | 0.2 |
| Oxalate secondary acid generator | 5 | 2.5 | 0 |
| Oxalate anion | 0 | 2.5 | 5 |
| Unprotonated image dye | 6 | 3.4 | 0.8 |
| Protonated image dye | 0 | 2.6 | 5.2 |

The two fixing reagents, cesium acetate and cesium iodide must now be considered separately. In the case of cesium acetate, the nucleophile derived from the fixing reagent (i.e., acetate) is more basic than either the image dye or the oxalate anion. The products of reaction of the diphenyliodonium salt with cesium acetate are phenyl acetate, cesium hexafluoroantimonate and phenyl iodide, so after all the fixing reagent has diffused in, the composition of the various parts of the acid-generating layer will be as follows:

|  | $D_{min}$ | Exposure Level $(_{max})/2$ | $D_{max}$ |
| --- | --- | --- | --- |
| Iodonium salt | 0 | 0.9 | 0.8 |
| $SbF_6^-$ | 1 | 1 | 1 |
| Phenyl iodide | 1 | 0.1 | 0.2 |
| Oxalate secondary acid generator | 5 | 2.5 | 0 |
| Oxalate anion | 0 | 2.5 | 5 |
| Unprotonated image dye | 6 | 4.4 | 1.8 |
| Protonated image dye | 0 | 1.6 | 4.2 |
| $Cs^+$ | 1 | 1 | 1 |
| Acetic acid | 0 | 1 | 1 |
| Phenyl acetate | 1 | 0 | 0 |

The iodonium salt has been destroyed only in the $D_{min}$ region; the intermediate density and $D_{max}$ regions are not fixed. Because the protonated image dye is more acidic than acetic acid, it converts cesium acetate to acetic acid and is itself returned to its unprotonated form, thus decolorizing some of the image dye, and removing the acetate nucleophile. Accordingly, iodonium superacid precursor is not destroyed in any but $D_{min}$ regions unless it reacts with the oxalate anion, which is a poorer nucleophile than acetate. The resultant fixing of $D_{min}$ regions only is not generally of concern in a binary imaging medium, because all the image dye is typically protonated in $D_{max}$ regions, so that further generation of acid from the iodonium salt will have no visible effect.

In contrast, when cesium iodide is employed as the reactive material, the iodide nucleophile is less basic than either the image dye or the oxalate anion produced from the secondary acid generator. Accordingly, the products of reaction of the diphenyliodonium salt with cesium iodide are phenyl iodide (two equivalents) and cesium hexafluoroantimonate, so after all the fixing reagent has diffused in, the composition of the various parts of the acid-generating layer will be as follows:

|  | $D_{min}$ | Exposure Level $(_{max})/2$ | $D_{max}$ |
| --- | --- | --- | --- |
| Iodonium salt | 0 | 0 | 0 |
| $SbF_6^-$ | 1 | 1 | 1 |
| Phenyl iodide | 2 | 1.9 | 1.8 |
| Oxalate secondary acid generator | 5 | 2.5 | 0 |
| Oxalate anion | 0 | 2.5 | 5 |
| Unprotonated image dye | 6 | 3.4 | 0.8 |

|  | Exposure Level | | |
|---|---|---|---|
|  | $D_{min}$ | $(_{max})/2$ | $D_{max}$ |
| Protonated image dye | 0 | 2.6 | 5.2 |
| $CS^+$ | 1 | 1 | 1 |
| $I^-$ | 0 | 0.1 | 0.2 |

No iodonium salt remains in any of the three regions. All levels of color are thus fixed, and the imaging medium is suitable for recording continuous-tone images.

In the simple nucleophilic process of the present invention, the nucleophilic fixing reagent cannot normally be incorporated into the acid-generating layer containing the superacid precursor and the secondary acid generator, for two reasons. Firstly, in almost all conceivable cases, the nucleophile will be more basic than the secondary acid generator, and will thus buffer superacid produced during imaging and interfere with the acid amplification (i.e., the superacid-catalyzed thermal decomposition of the secondary acid generator). Secondly, the thermal reaction between the nucleophile and the superacid precursor is likely to proceed sufficiently rapidly at room temperature to render the shelf life of the imaging medium too short. Accordingly, it is normally necessary to introduce the nucleophilic fixing reagent into the acid-generating layer or phase from a separate layer or phase, conveniently the color-change layer or phase. Thus, the choice of a nucleophilic fixing reagent depends not only upon its reactivity with the superacid precursor employed, but also upon its ability to diffuse through the imaging medium, i.e., typically through a polymeric matrix.

Reduction Process

In the reduction process of the present invention, the reactive material employed stoichiometrically reduces the superacid precursor present in at least the non-exposed areas of the imaging medium. Such a reduction can in some case produce an amount of acid equal to the molar amount of superacid precursor reduced so, for reasons discussed above, it may be necessary to introduce additional amounts of base into at least the non-exposed areas of the image to prevent the acid produced by reduction of the superacid precursor from affecting the quality of the image. Reducing agents with oxidation potentials more negative than the reduction potential of the superacid precursor in the particular environment of the imaging medium (typically an organic polymer such as polystyrene) would be expected to destroy the superacid precursor readily. However, reducing agents for which the electron transfer is somewhat thermodynamically unfavorable may still sometimes be useful in the reduction process because of the fast, irreversible decomposition of some superacid precursors (such as iodonium salts) which follows electron transfer.

The reduction potential of the preferred diaryliodonium salts is widely quoted in the literature as about −0.2 V, as measured against a standard calomel electrode (SCE) in acetonitrile solution. Although the reduction potentials of such salts in the polymers typically used in imaging media will vary somewhat from the values measured in acetonitrile, it has been found that reactive materials which do have oxidation potentials of about −0.2 V or less, as measured against SCE in acetonitrile solution, typically perform well in the present reduction process. For example, empirically it has been found that ferrocene and 1,1′-dimethylferrocene, having oxidation potentials of 0.44 and 0.34 V respectively against SCE in acetonitrile, are not effective fixing reagents, whereas decamethylferrocene, having an oxidation potential of −0.12 V under these conditions, is an effective fixing reagent.

Preferred fixing reagents for use in the reduction process include hydroquinones, catechols, enols, aminophenols, phenylenediamines, hydrazines, hydroxylamines and pyrazolones, and inorganic compounds such as low oxidation state transition metal salts and complexes.

Most reducing fixing reagents cannot be incorporated into the acid-generating layer containing the superacid precursor and the secondary acid generator, for two reasons. Firstly, in almost all cases, the reducing fixing reagent will be more basic than the secondary acid generator, and will thus buffer superacid produced during imaging and interfere with the acid amplification (i.e., the superacid-catalyzed thermal decomposition of the secondary acid generator). Secondly, the reaction between the reducing fixing reagent and the superacid precursor is likely to proceed sufficiently rapidly at room temperature to render the shelf life of the imaging medium too short. Accordingly, it is normally necessary to introduce the reducing fixing reagent into the acid-generating layer or phase from a separate layer or phase, conveniently the color-change layer or phase. Thus, the choice of a reducing fixing reagent depends not only upon its reactivity with the superacid precursor employed, but also upon its ability to diffuse through the imaging medium, i.e., typically through a polymeric matrix.

In some cases, however, the reducing reactive material may be incorporated into the imaging medium as two separate components, namely a non-reducing precursor to a reducing agent provided in the acid-generating layer or phase, and a reagent which is initially present in a different layer or phase (conveniently the color-change layer or phase) and which converts the precursor to the actual reducing species during the heating step following exposure. Such a two-component reducing reactive material may have the advantage of enabling the use of reducing reactive materials which do not diffuse rapidly through the medium employed. For example, hydroquinones, in their protonated (i.e., neutral) form, are not sufficiently strong reducing agents to destroy iodonium salts; the oxidation potential of hydroquinone itself has been measured by Hammerich and Parker (see Acta Chemica Scandinavica, B 36, 63–64 (1982)) to be 1.3 V measured against a standard calomel electrode in dichloromethane solution), but the deprotonated forms are much stronger reducing agents. The basicity of hydroquinones is also greatly altered by deprotonation; neutral hydroquinone is a very weak base ($pK_{Ha+}$ estimated at −7) whereas the mono- and doubly-deprotonated species are strongly basic (with conjugate acid pKa's of 9.85 and 11.4, respectively, measured in aqueous environments, although of course these values must be viewed with caution when considering the behavior of these species in non-polar media such as the organic polymers typically used in imaging media). Thus, hydroquinone itself, in its protonated (neutral) form, may be incorporated into the acid-generating layer containing an iodonium salt, sensitizing dye and secondary acid generator without affecting either the thermal stability of this layer or the efficiency of the superacid catalyzed thermal decomposition of the secondary acid generator. Upon heating, a basic material is introduced into the acid-generating layer by diffusion from another layer or phase, and this basic material deprotonates the hydroquinone, converting it to a strong reducing agent which reacts with the iodonium salt, and thereby fixes the image. This type of process is illustrated in the Examples below.

Nucleophile/Redox Catalyst Process

The nucleophile/redox catalyst process of the present invention, which is illustrated at C in FIG. 1, produces the same products from the decomposition of the superacid precursor as does the simple nucleophile process discussed above. However, the nucleophile/redox catalyst process is mechanistically rather different from the simple nucleophile process, in that the nucleophile/redox catalyst process relies upon an oxidation/reduction transfer catalyst to effect electron transfer so as to produce an electrophilic cation species from the superacid precursor, and it is this electrophilic cation species which interacts with the nucleophile. Accordingly, the nucleophile/redox catalyst process may employ weaker nucleophiles than the simple nucleophile process.

The preferred redox catalyst for use in the process is a copper compound. As illustrated in FIG. 1, the copper compound catalyzes the decomposition of the superacid precursor, with formation of at least one electrophilic species, while the nucleophile serves to react with the electrophilic species, thus preventing reaction between the electrophilic species and the image dye; this electrophilic species/image dye reaction, if allowed to proceed, tends to produce irreversibly colored products and hence unwanted color in the imaging medium, thereby destroying or at least undesirably affecting the image.

The copper compound used in the present process must of course be one which is effective in catalyzing the decomposition of the superacid precursor, and it appears that a copper(I) species is required for such catalysis. For example, copper(I) acetate may be used in the process. However, it is not necessary that the copper compound actually added to the imaging medium be a copper(I) species, since adding a copper(II) salt and a reducing agent will generate the necessary copper(I) species in situ, and in general the use of a copper(II) species and a reducing agent is more convenient in view of the susceptibility of copper(I) salts to air oxidation. The copper compound used must also, of course be compatible with the other components of the imaging medium; if, as is typical, the copper compound is incorporated into a layer or phase of the imaging medium containing a polymeric binder, the copper compound should be one which is readily dispersed in such a polymer binder. Preferred copper(II) salts include copper(II) acetate, copper(II) ethylacetoacetate, copper(II) acetylacetonate and copper(II) trifluoroacetylacetonate. Since the copper compound is a catalyst for decomposition of the superacid precursor, it is not necessary to use a molar quantity of copper equal to the molar quantity of superacid precursor remaining after imaging, and indeed the use of such a large amount of copper may be undesirable since the copper may contribute slightly to the $D_{min}$ of the image. The optimum amount of copper may be determined by routine empirical tests, but typically it has been found that about 1 mole of copper for every 10 moles of superacid precursor remaining after imaging is sufficient.

When a copper(II) salt is used together with a reducing agent, the reducing agent may be of any type which is effective in reducing copper(II) to copper(I) and which is compatible with the other components of the imaging medium. Conveniently the reducing agent is a secondary alcohol. The amount of reducing agent present should be sufficient to reduce all the copper(II) to copper (I). In some cases, it may not be necessary to provide the reducing agent as a separate component of the imaging medium, since some polymeric binders used in imaging media, e.g., poly(vinyl alcohol), contain appropriate reducing groups, and thus can themselves function as the reducing agent. Thus, the reducing agent may have the form of a polymeric binder in at least one of the acid-generating and color-change layers or phases of the imaging medium. Obviously, if the polymeric binder functions as the reducing agent, more than enough reducing agent will normally be present.

As already indicated, redox catalyzed decomposition of superacid precursors is believed to be accompanied by generation of reactive electrophilic species, and unless an appropriate nucleophile is present to react with these electrophilic species, they tend to cause undesirable color formation in the imaging medium. The nucleophile should be chosen so that the reactive electrophilic species generated by decomposition of the superacid precursor with the redox catalyst reacts with the nucleophile rather than with the image dye, and accordingly the reactive material should be a better nucleophile than the image dye. Preferred reactive materials for use in the present process are carboxylates. These carboxylates, in addition to being more nucleophilic than the image dye, should be derived from a carboxylic acid which is significantly less acidic than the protonated form of the image dye. The carboxylates can also function as a base required to neutralize any secondary acid which may be generated in non-exposed areas of the imaging medium. (Note that certain carboxylates may also be effective in the simple nucleophile process of the invention.)

Alternatively, the reactive material may be a nucleophilic amine. Suitable amines include primary amines (for example, 2-aminoethylimidazolidone), secondary amines and nucleophilic tertiary amines (for example, 4-dimethylaminopyridine). Non-nucleophilic tertiary amines, for example pentamethylpiperidines, are not recommended for use in the present process since they do not appear to be effective in preventing reaction between the electrophilic species and most image dyes.

The molar amount of the nucleophile provided should be at least equal to the molar amount of superacid precursor present, and preferably an additional amount of a basic material (which may or may not be the same as the nucleophile) should be provided to permit neutralization of any secondary acid generated by breakdown of the secondary acid generator before or during imaging.

The present process is not restricted to any particular method for the introduction of the redox catalyst and nucleophile into the non-exposed areas of the medium. However, obviously for convenience the fixing components are provided within the imaging medium prior to imaging. Desirably the fixing components are incorporated into the color-change layer or phase of the medium, although one or both may if desired be incorporated into a third layer or phase separate from both the acid-generating and color-change layers, provided that the components of this third layer or phase become intermixed with the components of the acid-generating and color-change layers or phases during the heating step of the process. For reasons similar to those discussed above in relation to the simple nucleophile and reduction processes, incorporation of the redox catalyst or the nucleophile into the acid-generating layer or phase is specifically not recommended, since reduction of shelf life of the imaging medium or interference with the superacid catalyzed decomposition of the secondary acid generator is likely to result.

General Considerations

For obvious reasons, whatever variation of the process of the present invention is used, the reactive material should be chosen so that it does not produce unwanted interactions with any components of the imaging medium, and does not adversely affect the quality of the images produced. Thus, the reactive material used for fixing should not contribute unwanted color to the medium, thus affecting its $D_{min}$, nor should the products resulting from destruction of the superacid precursor by the reactive material produce such unwanted color. The reactive material should not strongly absorb the wavelength(s) used in the imaging process so as to interfere with this process. The reactive material should be soluble or dispersible in the coating solutions normally used to prepare imaging media, and must be compatible with all the other components of such solutions. In addition, the reactive material should be chosen so that the time and temperature of heating required for destruction of the superacid precursor do not adversely affect the imaging medium, e.g., by causing buckling or distortion of the medium. Finally, as far as possible, the reactive material should be chosen so that it does not adversely affect the shelf life of the imaging medium.

Apart from the use of the reactive material for fixing, the process of the present invention may be of any of the types described in the applications and patents referred to in the "References to Related Applications and Patents" section above, and two preferred processes of the invention will now be described with reference to Tables 1 and 2 below; FIGS. 2A–2D of the accompanying drawings show the changes in acid concentration in exposed and non-exposed areas of the acid-generating layer at various stages during the second of these two preferred processes. For ease of illustration, FIGS. 2A–2D are not strictly to scale. Furthermore, in some parts of Tables 1 and 2 there may be some doubt as to which species are actually protonated and which salts are formed, and this may depend upon whether the various reactions are controlled thermodynamically or kinetically. However, these doubts do not affect the essential results of the imaging and fixing processes. The last section of each of Tables 1 and 2 shows the composition of the combined acid-generating and color-change layers after the components thereof have become intermixed.

The first preferred process of the present invention is of the '489 type and uses a conventional non-basic polycyclic aromatic sensitizer, 1-vinylpyrene (VPy) being shown in Table 1. As shown in this Table, prior to imaging both the exposed and non-exposed areas of the imaging medium comprises a quantity (shown in Table 1 as 1 mole for simplicity; all references to moles concerning Tables 1 and 2 (see below) refer to moles per unit area of the imaging medium, and are only by way of illustration, since the proportions of the various components may vary widely) of the vinylpyrene sensitizer, a larger molar quantity of a superacid precursor (5 moles of $Ph_2I^+SbF_6^-$ are shown in Table 1) and a still larger molar quantity (10 moles are shown in Table 1) of a secondary acid generator.

The imaging medium is first imagewise irradiated with radiation of a sensitizer wavelength (conveniently 365 nm for the vinylpyrene) which is absorbed by the sensitizer. During this ultra-violet imagewise exposure, in the exposed areas, the sensitizer photosensitizes the superacid precursor, so that decomposition of part of the superacid precursor occurs, with formation of unbuffered superacid, since a non-basic sensitizer is used. Table 1 shows, for purposes of illustration, 0.75 mole of superacid precursor being decomposed during the imagewise exposure.

The secondary reactions that follow the fragmentation of the superacid precursor are not entirely understood at present. However, it is likely that a phenyl radical is generated, which subsequently becomes attached to the radical cation derived from the non-basic polycyclic aromatic sensitizer (i.e., vinylpyrene) used, following which elimination

TABLE 1

| EXPOSED AREA | | NON-EXPOSED AREA | |
|---|---|---|---|
| Component | Moles | Component | Moles |
| PRIOR TO EXPOSURE | | | |
| VPy | 1 | VPy | 1 |
| Secondary acid generator | 10 | Secondary acid generator | 10 |
| $Ph_2I^+SbF_6^-$ | 5 | $Ph_2I^+SbF_6^-$ | 5 |
| AFTER IMAGEWISE EXPOSURE | | | |
| Ph-VPy | 0.75 | VPy | 1 |
| VPy | 0.25 | Secondary acid generator | 10 |
| $HSbF_6$ | 0.75 | $Ph_2I^+SbF_6^-$ | 5 |
| Secondary acid generator | 10 | | |
| $Ph_2I^+SbF_6^-$ | 4.25 | | |
| AFTER HEATING | | | |
| Ph-VPy | 0.75 | VPy | 1 |
| VPy | 0.25 | Secondary acid generator | 10 |
| $HSbF_6$ | 0.75 | $Ph_2I^+SbF_6$ | 5 |
| Secondary acid | 10 | | |
| $Ph_2I^+SbF_6^-$ | 4.25 | | |
| AFTER FIXING | | | |
| Ph-VPy | 0.75 | VPy | 1 |
| VPy | 0.25 | PhOAc | 5 |
| PhOAc | 4.25 | KOAC | 1 |
| HOAc | 6 | $KSbF_6$ | 5 |
| $KSbF_6$ | 5 | Cu reagent | 1 |
| Cu reagent | 1 | Secondary acid generator | 10 |
| Image dye/secondary acid salt | 4.75 | Unprotonated image dye | 10 |
| Ph-image dye/secondary acid salt | 4.25 | | |
| Unprotonated image dye | 1 | | |
| K/secondary acid salt | 1 | | | of a proton occurs, with formation of a phenylated form of the sensitizer, shown in Table 1 as "Ph-VPy." The exact site to which the phenyl radical becomes attached does not affect the essential imaging and fixing process of the invention.

Thus, at the end of the imagewise irradiation, unbuffered superacid is present in the exposed areas, whereas in the non-exposed areas no unbuffered superacid is present. In effect, the acid-generating layer now contains a "latent image" in superacid, although this image is not visible to the human eye. (The composition of the non-exposed areas of course remains unchanged by the imagewise ultra-violet exposure.)

The imaging medium is next heated. In the exposed areas, the unbuffered superacid present catalyzes the decomposition of the secondary acid generator, thus producing a large quantity of the secondary acid (10 moles are shown by way of example in Table 1). However, in the non-exposed areas, no unbuffered superacid is present, so that essentially no decomposition of the secondary acid generator occurs and essentially no secondary acid is generated.

In the final step of the process, as discussed in more detail below, the components of the acid-generating and color change layers become intermixed. Table 1 assumes that the color-change layer contains 10 moles of an indicator image dye, 1 mole of copper compound, 1 mole of a reducing agent (the products produced by oxidation of this reducing agent are ignored in Table 1 for simplicity) and 6 moles of a reactive material, shown as potassium acetate in Table 1 (where acetate is abbreviated "OAc"). In the non-exposed areas, the copper compound, the reducing agent and the reactive material decompose all remaining superacid precursor, with generation by the reactive material of the corresponding amount of phenyl acetate (Table 1 assumes), phenyl iodide (omitted from Table 1) and potassium hexafluoroantimonate. In the exposed areas, the potassium acetate is protonated by the superacid and some of the secondary acid. The copper reagent catalyzes decomposition of the remaining superacid precursor with the formation of phenyl cations, which react with the most nucleophilic species remaining, here assumed to be the image dye. (In practice, the decomposition of the superacid precursor is probably somewhat more complicated, and other products may be produced; however, the exact type of decomposition products produced does not affect the essential nature of the present process.)

In the exposed areas, the unbuffered superacid and 5.25 moles of the secondary acid are immediately neutralized by the potassium acetate. The decomposition of the superacid precursor is catalyzed by the copper compound, leading to formation of 4.25 moles of phenylated image dye. 4.75 Moles of secondary acid reversibly protonate, form a salt with, the image dye. Both the phenylated and the protonated image dyes are colored. 1 Mole of the image dye remains in its unprotonated, leuco form.

In the non-exposed areas, the decomposition of the superacid precursor consumes 5 moles of potassium acetate, leaving 1 mole of potassium acetate remaining in these areas. None of the image dye is protonated, all remaining in its unprotonated, leuco form. The provision of the excess potassium acetate serves to ensure that, if a small amount of uncatalyzed thermal decomposition of the secondary acid generator does occur in non-exposed areas during the heating step, the small amount of secondary acid resulting will be neutralized by potassium acetate before the secondary acid can effect changes in the image dye. The excess potassium acetate also ensures that, if minor decomposition of the secondary acid generator does occur after the imaging process has been completed, the minor amounts of acid generated will be neutralized by the potassium acetate and thus will not affect image dye in the non-exposed areas of the final image.

It will be seen from Table 1 that the "neutralization" of the superacid and some of the secondary acid by the potassium acetate produces acetic acid. Although acetic acid is normally regarded as an acid, it is insufficiently acidic in the polymeric binders in which the present process is normally carried out, to protonate the sensitizer or the image dye, and is thus not regarded as an acid for present purposes.

From the foregoing description, it will be seen that, in the exposed areas, the superacid catalyzes the breakdown of the secondary acid generator, so that the final quantity of secondary acid present is substantially larger than the quantity of unbuffered superacid produced directly by the imagewise radiation acting on the superacid precursor, although of course the secondary acid is typically a weaker acid than the superacid itself. This "chemical amplification" of the superacid by the secondary acid generator increases the number of moles of acid generated per Einstein of radiation absorbed, and thus increases the contrast of the image produced by the present process as compared with simple generation of superacid by a superacid precursor. In practice, it has been found that, under proper conditions, at least 20, and in some cases 100 or more, moles of secondary acid can be liberated for each mole of unbuffered superacid present in the exposed areas following the imagewise irradiation.

Note that if the copper/reducing agent/potassium acetate fixing reagent is replaced by a fixing agent containing (say) 5 moles of a reducing agent and 6 moles of a base (which could be potassium acetate), as in a typical reduction process of the present invention, the final result is similar. The reducing agent will reduce all the diphenyliodonium salt present in both the exposed and non-exposed areas, thus producing 5 moles of $HSbF_6$ in both exposed and non-exposed areas. All this unbuffered superacid is immediately neutralized by 5 moles of the base in both the exposed and unexposed areas. In the exposed areas, the last mole of base neutralizes 1 mole of secondary acid, whereas in the non-exposed areas, the last mole of base remains unchanged. Although phenylated image dye is unlikely to be formed in the reduction process, because the phenylated and the protonated image dyes have the same chromophore, the amounts of colored image dye will be the same.

The second preferred process shown in Table 2 below, and in FIGS. 2A–2D of the accompanying drawings, is of the indicator sensitizing type described in the aforementioned copending application Ser. No. 08/232,725, filed Apr. 25, 1994, now U.S. Pat. No. 5,441,850, and its continuation-in-part application Ser. No. 08/430,420 and uses as the sensitizer an indicator sensitizing dye having an unprotonated form and a protonated form.

TABLE 2

| EXPOSED AREA | | NON-EXPOSED AREA | |
|---|---|---|---|
| Component | Moles | Component | Moles |
| PRIOR TO USE | | | |
| [S-DYE] | 1 | [S-DYE] | 1 |
| Secondary acid generator | 10 | Secondary acid generator | 10 |
| $Ph_2I^+SbF_6^-$ | 5 | $Ph_2I^+SbF_6^-$ | 5 |
| AFTER INITIAL ULTRA-VIOLET EXPOSURE | | | |
| $[S-DYE-H]^+SbF_6^-$ | 0.75 | $[S-DYE-H]^+SbF_6^-$ | 0.75 |
| [S-DYE] | 0.25 | [S-DYE] | 0.25 |
| Secondary acid generator | 10 | Secondary acid generator | 10 |
| $Ph_2I^+SbF_6^-$ | 4.25 | $Ph_2I^+SbF_6^-$ | 4.25 |
| AFTER IMAGEWISE VISIBLE EXPOSURE | | | |
| $[S-DYE-H]^+SbF_6^-$ | 0.25 | $[S-DYE-H]^+SbF_6^-$ | 0.75 |
| $Ph-[S-DYE-H]^+SbF_6^-$ | 0.75 | [S-DYE] | 0.25 |
| $HSbF_6$ | 0.5 | Secondary acid generator | 10 |
| Secondary acid generator | 10 | $Ph_2I^+SbF_6^-$ | 4.25 |
| $Ph_2I^+SbF_6^-$ | 3.5 | | |
| AFTER HEATING | | | |
| $[S-DYE-H]^+SbF_6^-$ | 0.25 | $[S-DYE-H]^+SbF_6^-$ | 0.75 |
| $Ph-[S-DYE-H]^+SbF_6^-$ | 0.75 | [S-DYE] | 0.25 |
| $HSbF_6$ | 0.5 | Secondary acid generator | 10 |
| Secondary acid | 10 | $Ph_2I^+SbF_6^-$ | 4.25 |
| $Ph_2I^+SbF_6^-$ | 3.5 | | |
| AFTER FIXING | | | |
| [S-DYE] | 0.25 | [S-DYE] | 1 |
| Ph-[S-DYE] | 0.75 | HOAc | 0.75 |
| HOAc | 6 | KOAc | 1 |
| Image dye/secondary acid salt | 5.5 | Secondary acid generator | 10 |
| Unprotonated image dye | 1 | Cu reagent | 1 |
| Ph-image dye/secondary acid salt | 3.5 | PhOAc | 4.25 |
| Cu reagent | 1 | Unprotonated image dye | 10 |
| $KSbF_6$ | 5 | $KSbF_6$ | 5 |
| K/secondary acid salt | 1 | | |

As shown in Table 2, the imaging medium initially contains the sensitizing dye in its unprotonated form. Both the exposed and non-exposed areas initially comprise 1 mole of the sensitizing dye, a larger molar quantity of a superacid precursor (5 moles of $Ph_2I^+SbF_6^-$ are shown in Table 2; a suitable quantity of a non-basic polycyclic aromatic sensitizer, such as pyrene, is also included in the medium but is not shown in Table 2) and a still larger molar quantity (10 moles are shown in Table 2) of a secondary acid generator.

Figure 2A:
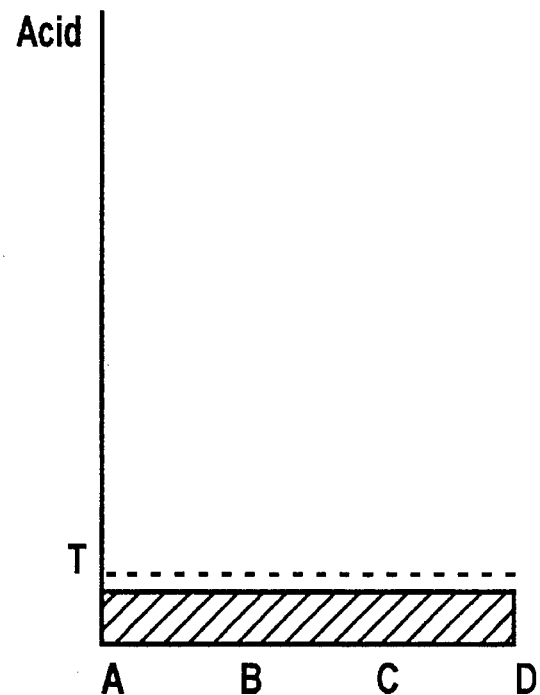
FIGS. 2A–2D show the acid concentrations in the exposed and non-exposed areas of the acid-generating layer during the various steps of a first preferred process of the present invention.

The imaging medium is first blanket irradiated with radiation which is not absorbed by the sensitizing dye but is absorbed by the non-basic polycyclic aromatic sensitizer, with decomposition of superacid precursor, this radiation typically being near ultra-violet radiation; the amount of radiation applied is sufficient to cause the decomposition of less than one mole (0.75 mole is used for illustration in Table 2 and FIG. 2A) of the superacid precursor, thus producing a corresponding amount of superacid. This superacid immediately protonates the sensitizing dye, producing a salt of the dye shown as "$[S-DYE-H]^+SbF_6^-$" in Table 2, and leaving no unbuffered superacid present in the acid-generating layer. Thus, after this initial ultra-violet exposure, as shown in Table 2, all areas of the acid-generating layer contain 0.75 mole of the sensitizing dye salt, 0.25 mole of unprotonated sensitizing dye, 4.25 moles of superacid precursor and 10 moles of secondary acid generator. This situation is illustrated in FIG. 2A, which shows the acid level as 0.75 times a threshold level (indicated by T in FIGS. 2A–2D) at which all the sensitizing dye becomes protonated.

(The phenyl radical generated by decomposition of the superacid precursor during this blanket exposure is ignored in Table 2, since as mentioned above in connection with Table 1, these phenyl radicals will usually become attached to the non-basic sensitizer. Even if some of the phenyl radicals generated do become attached to sensitizing dye molecules, this will not significantly affect the overall course of the process shown in Table 2 and FIG. 2, since a phenylated form of the sensitizing dye would be expected to undergo the same type of protonation and deprotonation reactions, with similar absorption shifts, as the non-phenylated dye.)

Figure 2B:
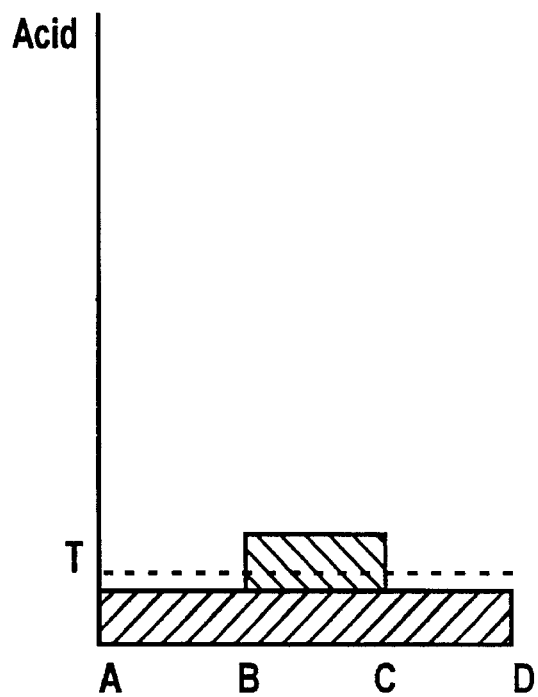

After the initial ultra-violet exposure, the imaging medium is imagewise exposed to radiation in the first wavelength range; visible radiation is shown for illustration in Table 2. As shown in Table 2 and FIG. 2B, in the area BC of the acid-generating layer which is exposed to the visible radiation, this visible radiation causes the protonated sensitizing dye to photosensitize the superacid precursor and hence bring about the decomposition of a further 0.75 mole of superacid precursor, with generation of a further 0.75 mole of superacid, so that the total amount of acid present exceeds the threshold T. The additional superacid generated by the visible exposure protonates the remaining 0.25 mole of previously unprotonated sensitizing dye, leaving 0.5 mole of unbuffered superacid in the exposed area BC, as shown in FIG. 2B. (For purposes of illustration, FIG. 2B shows the acid generated in the ultraviolet and visible exposures separately, although of course no difference exists chemically.) In the non-exposed areas AB and CD no change in the acid level occurs, the acid concentration remains below the threshold T, and no unbuffered superacid is present after the visible exposure.

Thus, at the end of the imagewise irradiation, unbuffered superacid is present in the exposed areas, whereas in the non-exposed areas no unbuffered superacid is present, all the superacid generated being buffered by the sensitizing dye. In effect, the acid-generating layer now contains a "latent image" in superacid, although this image is not visible to the human eye.

It is expected that the decomposition of the superacid precursor by the sensitizing dye during the imagewise visible exposure will be accompanied by phenylation of the photooxidized sensitizing dye by the phenyl radical derived from the superacid precursor, followed by elimination of a proton. Accordingly, at the end of the imagewise exposure, the exposed areas will contain 0.75 mole of a phenylated product derived from the protonated sensitizing dye, this product being denoted Ph-[S-DYE-H]$^+$SbF$_6^-$ in Table 2. The remaining 0.25 mole of sensitizing dye will remain in the [S-DYE-H]$^+$SbF$_6^-$ form. Also present in the exposed areas will be 0.5 mole of unbuffered superacid, the 3.5 remaining moles of superacid precursor, and the 10 moles of secondary acid generator, which remain unchanged at this point. (The composition of the non-exposed areas of course remains unchanged by the imagewise visible exposure.)

Figure 2C:
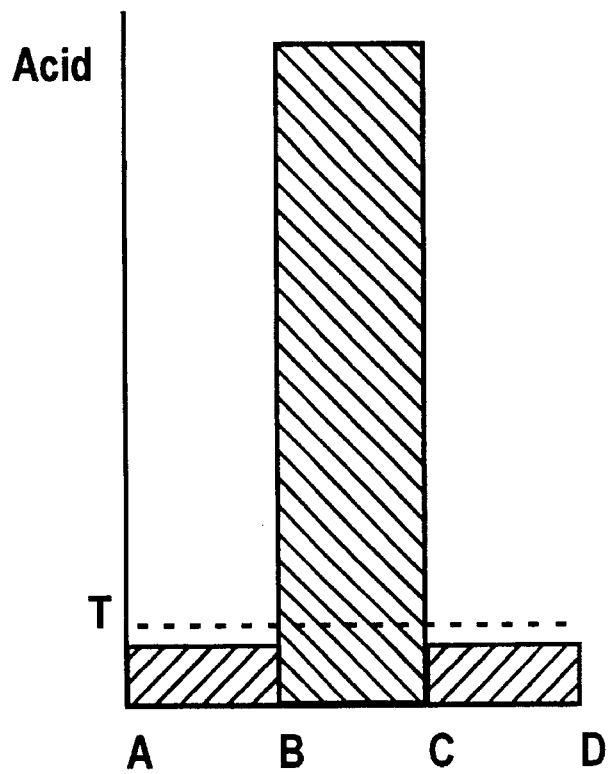

The imaging medium is next heated. In the exposed area BC, the unbuffered superacid present catalyzes the decomposition of the secondary acid generator, thus producing a large quantity of the secondary acid (10 moles are shown by way of example in Table 2; FIG. 2C is not strictly to scale). However, in the non-exposed areas AB and CD, no unbuffered superacid is present, and the sensitizing dye/superacid salt does not catalyze the decomposition of the secondary acid generator, so that essentially no decomposition of the secondary acid generator occurs and essentially no secondary acid is generated.

In the final step of the process, as discussed in more detail below, the components of the acid-generating and color change layers become intermixed. Table 2 assumes that the color-change layer contains 10 moles of an indicator image dye, 1 mole of copper compound, 1 mole of a reducing agent (the products produced by oxidation of this reducing agent are ignored in Table 2 for simplicity) and 6 moles of a reactive material, shown as potassium acetate in Table 2. Table 2 further assumes that the image dye is more basic than the sensitizing dye. In the non-exposed areas, the copper compound, the reducing agent and the reactive material decompose all remaining superacid precursor, with generation by the reactive material of the corresponding amount of phenyl acetate (Table 2 assumes), phenyl iodide (omitted from Table 2) and potassium hexafluoroantimonate. In the exposed areas, the potassium acetate is protonated by the superacid and some of the secondary acid. The copper reagent catalyzes decomposition of the remaining superacid precursor with the formation of phenyl cations, which react with the most nucleophilic species remaining, here assumed to be the image dye.

Figure 2D:
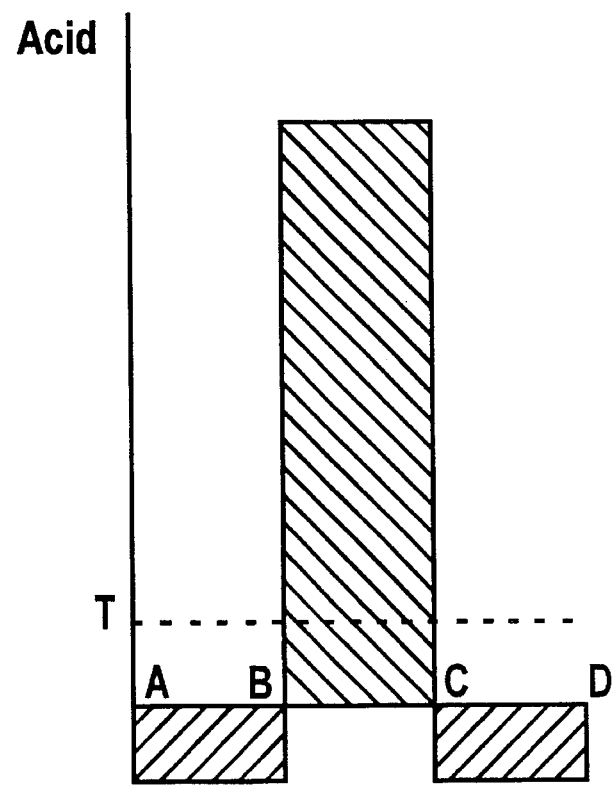

In the exposed areas, the unbuffered superacid and 4.5 moles of the secondary acid are immediately neutralized by the potassium acetate, which also deprotonates the protonated forms of both the original sensitizing dye and the phenylated form of this dye to produce the corresponding unprotonated dyes, thereby removing the absorption in the first wavelength range due to the sensitizing dye. The decomposition of the superacid precursor is catalyzed by the copper compound, leading to the formation of 3.5 moles of phenylated image dye. 5.5 Moles of the secondary acid reversibly protonate and form a salt with the image dye. Both the phenylated and the protonated image dyes are colored. 1 Mole of the image dye remains in its unprotonated, leuco form. FIG. 2D shows graphically the 5.5 moles of secondary acid (3.5 moles of aryl cation are also formed) remaining in the exposed areas.

In the non-exposed areas, the potassium acetate deprotonates the sensitizing dye, returning it to its unprotonated form, and thus reducing the $D_{min}$ of the image in this range (assuming, as is usual, that the absorption change in the image dye is an increase in absorption, i.e., increase in color, in the relevant wavelength range so that the non-exposed areas are the $D_{min}$ areas of the image). The decomposition of the superacid precursor and the deprotonation of the sensitizing dye consume 5 moles of potassium acetate; 1 mole of potassium acetate remains in the non-exposed areas. This excess of base is represented in FIG. 2D as −1 moles of remaining acid. None of the image dye is protonated, all remaining in its unprotonated, leuco form. The provision of the excess potassium acetate serves to ensure that, if a small amount of uncatalyzed thermal decomposition of the secondary acid generator does occur in non-exposed areas AB and CD during the heating step, the small amount of secondary acid resulting will be neutralized by base before the secondary acid can effect changes in the image dye, as described in more detail below. The excess potassium acetate also ensures that, if minor decomposition of the secondary acid generator does occur after the imaging process has been completed, the minor amounts of acid generated will be neutralized by the potassium acetate and thus will not affect image dye in the non-exposed areas of the final image.

It will be again be seen that replacing the copper/reducing agent/potassium acetate with a reducing fixing reagent comprising reducing agent and a base will produce the same results in so far as the amounts of colored image dye are concerned.

The fixing process of the present invention may be used with any of the imaging processes described in the aforementioned application Ser. No. 08/232,725, now U.S. Pat. No. 5,441,850 or the aforementioned application Ser. No. 08/430,420.

One advantage of the present process is that, at least in many preferred embodiments of the invention, it is possible to compensate for any premature breakdown of the superacid precursor which may occur before use of the imaging medium. Such premature breakdown may occur, for example, by exposure of the imaging medium to radiation during transportation and storage or because the mixture of the superacid precursor and the sensitizing dye in the acid-generating layer or phase undergoes slow decomposition on protracted storage. If, as in the second of the two preferred processes described above, the first step of the process is blanket exposure of the imaging medium to radiation in the second wavelength range to generate superacid and convert the sensitizing dye to its protonated form, the blanket exposure can be adjusted to ensure that the present process works properly, even if some decomposition of the superacid precursor has occurred earlier.

For example, to take an extreme case purely for purposes of illustration, suppose that the imaging medium shown in Table 2 is exposed to so much ultra-violet radiation during storage and transport that premature breakdown of 0.5 mole of superacid precursor occurs. At the beginning of imaging, all areas of the medium thus contain 0.5 mole of sensitizing dye, 10 moles of secondary acid generator, 4.5 moles of superacid precursor and 0.5 mole of protonated sensitizing dye. After spectral analysis to determine the amount of protonated sensitizing dye already present, the initial ultraviolet exposure may be adjusted so that, in exposed areas, only a further 0.25 mole of superacid precursor is decomposed. After this exposure, the medium will contain 0.75 mole of protonated sensitizing dye, and will thus be in exactly the same condition as if no premature breakdown of the superacid precursor had occurred before imaging, but the initial ultra-violet exposure generated 0.75 mole of superacid. Also, provided that no substantial breakdown of superacid precursor occurs during transportation and storage, a medium of the present invention which is produced with the sensitizing dye in its unprotonated form is, prior to imaging, essentially insensitive to radiation of the wavelength used for the imagewise exposure, since the unprotonated sensitizing dye, even when exposed to such radiation, does not cause substantial decomposition of the superacid precursor.

For similar reasons, the present process is also relatively insensitive to variations in the radiation used for the imagewise exposure, such as variations in laser output, differences between individual lasers in an array used to form the imaging beam, timing errors in laser drivers, etc. For example, in the process shown in Table 2, the imagewise exposure causes decomposition of 0.75 mole of superacid precursor. If the imaging radiation delivered to the imaging medium varies by ±20%, some exposed areas will experience decomposition of 0.6 mole of superacid precursor, while others will experience decomposition of 0.9 mole. Thus, after the imagewise exposure, the concentration of unbuffered superacid in the exposed areas will vary from 0.35 to 0.65 mole. With appropriate control of the heating step, this range of variation in unbuffered superacid concentration will have minimal effects on the final image in cases where the medium is designed to be essentially binary, i.e., any specific pixel is either at $D_{min}$ or at $D_{max}$.

Since the present process relies upon the production of a first acid strong enough to catalyze thermal decomposition of the secondary acid generator (this first acid may be unbuffered superacid), it is highly desirable that the process be conducted under essentially anhydrous conditions; as chemists are well aware, the most powerful acidic species that can exist in the presence of more than one equivalent of water is the hydroxonium (hydronium) ion, $[H_3O]^+$. Accordingly, if the medium in which the present process is conducted contains water, at least part of the first acid produced by the present process will simply generate hydroxonium ion. However, in the absence of water, the decomposition of the superacid precursor yields an acidic species much stronger than hydroxonium ion, and this acidic species can effect the acid-catalyzed decomposition of various secondary acid generators which hydroxonium ion cannot. Typically, the present process is carried out with the superacid precursor and the sensitizer dispersed in a polymeric binder, and such binders can readily be chosen to provide an essentially anhydrous environment for the process.

For the present process to occur, it is obviously necessary that the sensitizer, having absorbed the sensitizer radiation, initiate the decomposition of the superacid precursor. As is well known to those skilled in the art, for such initiation to occur, it is necessary to choose the sensitizer and the superacid precursor so that the excited state of the sensitizer can reduce the superacid precursor. The choice of appropriate pairs of sensitizers and superacid precursors may be made empirically, although techniques familiar to those skilled in the art, such as use of the Rehm-Weller Equation, may be used to reduce the amount of empirical testing necessary.

In principle, in the present process the mixing of the components of the acid-generating and color-change layers or phases should be effected after the generation of the secondary acid from the secondary acid generator. However, in practice both the generation of the secondary acid in the acid-generating layer and the mixing of the components of the two layers or phases may be effected in a single heating step, since the acid-catalyzed decomposition of the secondary acid generator will typically be essentially complete before mixing of the two layers or phases becomes significant, and thus before the copper compound and reactive material present in the color-change layer or phase begin to decompose the superacid present in the acid-generating layer or phase.

Obviously, it is important that the components of the acid-generating layer or phase and the color-change layer or phase not mix prematurely. In practice, the present imaging medium will typically be formed by coating acid-generating and color-change layers from a solution or dispersion on to a support. To prevent premature mixing, it is usually desirable to coat one layer from an aqueous medium and the other from a non-aqueous medium. Typically, the acid-generating layer is coated from an organic medium and the color-change layer from an aqueous medium. Thus, typically it is advantageous to use a copper compound and a reactive material which are readily water-soluble or -dispersible so that these components can be included in the aqueous medium used to coat the color-change layer.

Any of the known superacid precursors, for example diazonium, phosphonium, sulfonium and iodonium compounds, may be used in this invention, but iodonium compounds are preferred. Especially preferred superacid precursors are diphenyliodonium salts, specifically (4-octyloxyphenyl)phenyliodonium hexafluorophosphate and hexafluoroantimonate, bis(n-dodecylphenyl)iodonium hexafluoroantimonate and (4-(2-hydroxytetradecan-1-yloxy)phenyl)phenyl iodonium hexafluoroantimonate.

When the present process is of the '489 type, any conventional non-basic polycyclic aromatic sensitizer may be employed. When the present process is of the '612 type, any infra-red sensitizer capable of sensitizing decomposition of the superacid precursor with the production of unbuffered superacid may be employed. Preferably, the infra-red sensitizer is a squarylium dye, since squarylium dyes tend to have high infra-red extinction coefficients, have long singlet excited state lifetimes (which assists the electron transfer reactions upon which the present process depends), show little tendency to aggregate in polymeric films, and have low visible absorptions. Examples of infra-red dyes useful in the present process are:

a) dyes comprising an inner salt of a compound of the formula:

$$Q^1=Z-Q^2$$

wherein:

Q$^1$ is a 4-(benz[b]-4H-pyrylium)methylidene, 4-(benz[b]-4H-thiopyrylium)methylidene or 4-(benz[b]-4H-selenopyrylium)methylidene grouping;

Z is a 1,3-(2-hydroxy-4-oxo-2-cyclobutylidene) hydroxide or 1,3-(2-hydroxy-4,5-dioxo-2-cyclopentylidene) hydroxide ring; and Q$^2$ is a 4-(benz[b]-4H-pyran-4-ylidene)methyl, 4-(benz[b]-4H-thiopyran-4-ylidene)methyl or 4-(benz[b]-4H-selenopyran-4-ylidene)methyl grouping;

wherein at least one of the groupings Q$^1$ and Q$^2$ carries at its 2-position a substituent in which a non-aromatic carbon atom is bonded directly to the benzpyrylium, benzthiopyrylium or benzselenopyrylium nucleus, subject to the proviso that if said 2-substituent contains an aromatic nucleus, this aromatic nucleus is not conjugated with the benzpyrylium, benzthiopyrylium or benzselenopyrylium nucleus to which it is attached (see U.S. Pat. No. 5,405,976 and the corresponding International Application No. PCT/US91/08695, Publication No. WO 92/09661);

b) squarylium compounds of the formula:

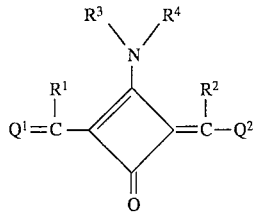

in which $Q^1$ and $Q^2$ are each a chromophoric group having an unsaturated system conjugated with the squarylium ring and such that in the compounds of formulae $Q^1CH_2R^1$ and $Q_2CH_2R^2$ the methylene hydrogens are active hydrogens, $R^1$ and $R^2$ are each independently a hydrogen atom or an aliphatic or cycloaliphatic group, and $R^3$ and $R^4$ are each independently a hydrogen atom, or an aliphatic, cycloaliphatic, aromatic or heterocyclic group, or one of $R^3$ and $R^4$ is a hydrogen atom and the other is an organosulfonyl group, or $R^3$ and $R^4$ together with the intervening nitrogen atom form a cycloaliphatic or aromatic ring (see U.S. Pat. Nos. 5,227,498 and 5,354,873, and the corresponding International Application No. PCT/US92/09992, Publication No. WO 93/09956); and c) squarylium compounds of the formula:

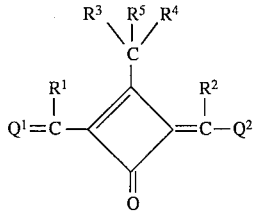

in which:

$Q^1$ and $Q^2$ are each a chromophoric group having an unsaturated system conjugated with the squarylium ring and such that in the compounds of formulae $Q^1CH_2R^1$ and $Q^2CH_2R^2$ the methylene hydrogens are active hydrogens;

$R^1$ and $R^2$ are each independently a hydrogen atom or an aliphatic or cycloaliphatic group; and $R^3$, $R^4$ and $R^5$ are each independently a hydrogen atom, or an aliphatic, cycloaliphatic, aromatic or heterocyclic group, or an electron-withdrawing group able to lower the electron density at the carbon atom to which it is attached, subject to the provisoes that:

two of $R^3$, $R^4$ and $R^5$ may form a divalent group of which a single atom is double bonded to the carbon atom to which the two groups are attached, or all three of $R^3$, $R^4$ and $R^5$ may form a trivalent group of which a single atom is triple bonded to the carbon atom to which the three groups are attached, or two of $R^3$, $R^4$ and $R^5$ may, together with the carbon atom to which they are attached, form a ring, or all three of $R^3$, $R^4$ and $R^5$ may, together with the carbon atom to which they are attached, form an unsaturated ring (see U.S. Pat. No. 5,227,499 and the corresponding International Application No. PCT/US92/09992, Publication No. WO 93/09956).

When the sensitizer used in the present process is an indicator sensitizing dye, it may be any molecule, the absorption spectrum of which depends reversibly upon its state of protonation and which can photosensitize decomposition of the superacid precursor used, provided of course that the dye is compatible with the other components of the imaging medium. The state of the indicator sensitizing dye called herein the "unprotonated form" need not necessarily be a neutral molecule; the unprotonated form may be anionic but capable of being protonated to a neutral or cationic form. For example, fluorescein monomethyl ether can exist in a non-aqueous medium in anionic (deprotonated), neutral or cationic (protonated) forms; both the anionic and cationic forms are yellow, while the neutral form is colorless to the eye but absorbs strongly in the mid-ultra-violet region (around 320 nm). The spectral shift of the sensitizing dye upon protonation may be either hypsochromic (to shorter wavelength) or bathochromic (to longer wavelength). Fluorescein monomethyl ether exhibits both behaviors; the first protonation of the anionic form causes a hypsochromic shift, while the second protonation to the cationic form causes a bathochromic shift.

Preferred indicator sensitizing dyes for use in the present process include fluoran dyes, phthalide dyes, xanthene dyes, acridine dyes, hydroxypyrylium dyes, hydroxythiopyrylium dyes, styrylpyridinium dyes, styrylquinolinium dyes, and other substituted quinolinium, isoquinolinium and pyridinium dyes, with triarylpyridinium, quinolinium and xanthene dyes being especially preferred. Specific triarylpyridinium dyes which have been found useful in the present invention are protonated forms of:

2,4,6-tris(4-methoxyphenyl)pyridine;

2,6-bis(4-methoxyphenyl)-4-(2-thienyl)pyridine;

2,6-bis(4-methoxyphenyl)-4-(2-(4-bromophenyl)pyridine;

2,6-bis(4-methoxyphenyl)-4-(2-naphthyl)pyridine;

2,4-bis(4-methoxyphenyl)-6-(2-naphthyl)pyridine;

2,4,6-tris(2,4,6-trimethoxyphenyl)pyridine; and 2,6-bis(4-methoxyphenyl)-4-(2-(1,4-dimethoxy)naphthyl)pyridine.

A specific preferred triarylpyridinium dyes is the protonated form of 2,4,6-tris(2,4-dimethoxyphenyl)pyridine.

A specific preferred quinolinium dye is the protonated form of 2-[2-[2,4-bis[octyloxy]phenyl]ethen-1-yl]quinoline (the unprotonated form of this dye is available from Yamada Chemical Co., Kyoto, Japan), while a specific preferred xanthene dye is the protonated form of 3',6'-bis[N-[2-chlorophenyl]-N-methylamino]spiro[2-butyl-1,1-dioxo[1,2-benzisothiazole-3(3H),9'-(9H)xanthene]](which may be prepared as described in U.S. Pat. No. 4,345,017).

Methods for the preparation of triarylpyridinium dyes are described in the literature. One convenient method for the preparation of such dyes bearing identical substituents at the 2- and 6-positions is described in Weiss, J. Am. Chem. Soc., 74, 200 (1952) and comprises heating a mixture of an acetophenone, an aldehyde (that containing the desired 4-substituent) and ammonium acetate in acetic acid. A dihydropyridine is produced as the penultimate intermediate, but is oxidized to the pyridine by the intermediate chalcone. A second method is similar to the first, but uses hydroxylamine or unsymmetrical dimethylhydrazine in place of ammonium acetate; the penultimate intermediate in these cases are the N-hydroxydihydropyridine or N,N-dimethylaminodihydropyridine, which undergo elimination and aromatization without the need for an oxidizing agent. A third method, described in Krohnke, Synthesis, 1976, 1, can produce asymmetric triarylpyridinium dyes. In this third method, an aryl aldehyde containing the desired 4-substituent and an acetophenone containing the desired 2-substituent are reacted to form an intermediate chalcone, which is then reacted with the phenacylpyridinium salt derived from the acetophenone containing the desired 6-substituent. The resultant pyridinium-substituted dihydropyridine undergoes loss of pyridine with aromatization.

Any secondary acid generator that is capable of acid-catalyzed breakdown to give a secondary acid may be used in the present process. One preferred group of secondary acid generators are 3,4-disubstituted-cyclobut-3-ene-1,2-diones (hereinafter for convenience called "squaric acid derivatives") capable of generating squaric acid or an acidic derivative thereof, since squaric acid and its acidic derivatives are strong acids well suited to effecting color changes in acid-sensitive materials. Especially preferred squaric acid derivatives are those in which there is bonded to the squaric acid ring, via an oxygen atom, an alkyl or alkylene group, a partially hydrogenated aryl or arylene group, or an aralkyl group. The acid-catalyzed decomposition of these squaric acid derivatives causes replacement of the original alkoxy, alkyleneoxy, aryloxy, aryleneoxy or aralkoxy group of the derivative with a hydroxyl group, thereby producing squaric acid or an acidic squaric acid derivative having one hydroxyl group.

The exact mechanism by which squaric acid or an acidic derivative thereof is formed in the present process may vary depending upon the type of squaric acid derivative employed. In some cases, for example di-t-butyl squarate, one or both groups attached via oxygen atoms to the squaric acid ring may thermally decompose to yield an alkene or arene, thereby converting an alkoxy or aryloxy group to a hydroxyl group and forming the squaric acid or acidic derivative thereof. In other cases, for example 3-amino-4-(p-vinylbenzyloxy)cyclobut-3-ene-1,2-dione, there is no obvious mechanism for formation of a corresponding alkene or arene, and it appears that the mechanism of acid formation is migration of the vinylbenzyl carbocation or similar group to a different position within the molecule (probably to the amino group), and protonation of the remaining oxygen atom to form a hydroxyl group at the position from which the group migrates. In other cases, neither of these pathways is possible. However, in all cases the net effect is the replacement of the alkoxy, alkyleneoxy, aryloxy, aryleneoxy or aralkoxy group present in the original derivative with a hydroxyl group to form squaric acid or an acidic derivative thereof.

Those skilled in the art of organic chemistry will appreciate that the susceptibility to thermal decomposition of the squaric acid derivatives preferred for use in the present process is related to the stability of the cation produced from the ester grouping during the decomposition process. Although the stability of specific cations may be influenced by a variety of factors, including steric factors, which may be peculiar to a particular ester, in general it may be said that the squaric acid esters preferred for use in the present process are:

(a) primary and secondary esters of squaric acid in which the α-carbon atom (i.e., the carbon atom bonded directly to the —O— atom of the squarate ring) bears a non-basic cation-stabilizing group. This cation-stabilizing group may be, for example, an $sp^2$ or sp hybridized carbon atom, or an oxygen atom;

(b) tertiary esters of squaric acid in which the α-carbon atom does not have an $sp^2$ or sp hybridized carbon atom directly bonded thereto; and (c) tertiary esters of squaric acid in which the α-carbon atom does have an $sp^2$ or sp hybridized carbon atom directly bonded thereto, provided that this $sp^2$ or sp hybridized carbon atom (or at least one of these $sp^2$ or sp hybridized carbon atoms, if more than one such atom is bonded directly to the α-carbon atom) is conjugated with an electron-withdrawing group.

It will be apparent to skilled organic chemists that, provided one of the aforementioned types of ester groupings is present in the squaric acid derivative to produce one hydroxyl group after thermal decomposition, the group present in place of the other hydroxyl group of squaric acid is of little consequence, provided that this other group does not interfere with the thermal decomposition. Indeed, the wide variation possible in this other group has the advantage that this group can be varied to control other properties of the derivative, for example its compatibility with other components of the imaging medium, or its solubility in solvents used to form coating solutions used in the preparation of the imaging medium.

Examples of squaric acid derivatives useful in the present processes include:

(a) those of the formula:

(I)

in which $R^1$ is an alkyl group, a partially hydrogenated aromatic group, or an aralkyl group, and $R^2$ is a hydrogen atom or an alkyl, cycloalkyl, aralkyl, aryl, amino, acylamino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer. Among the derivatives of Formula I, especially preferred groups are those in which (a) $R^1$ is an unsubstituted or phenyl substituted alkyl group containing a total of not more than about 20 carbon atoms, and $R^2$ is an alkyl group containing not more than about 20 carbon atoms, or a phenyl group (which may be substituted or unsubstituted); and (b) $R^1$ is a benzyl group and $R^2$ is an amino group.

(b) those of the formula:

(II)

in which $R^1$ and $R^3$ independently are each an alkyl group, a partially hydrogenated aryl group or an aralkyl group, subject to the proviso that either or both of the groups $R^1$ and $R^3$ may be attached to a polymer. Among the derivatives of Formula II, an especially preferred group are those in which $R^1$ and $R^3$ are each independently an unsubstituted or phenyl substituted alkyl group containing a total of not more than about 20 carbon atoms. Specific preferred compounds of Formula II are those in which $R^1$ and $R^3$ are each a tertiary butyl group, a benzyl group, an α-methylbenzyl group or a cyclohexyl group, namely di-tertiary butyl squarate, dibenzyl squarate, bis(α-methylbenzyl) squarate and dicyclohexyl squarate.

(c) those of the formula:

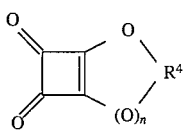

in which n is 0 or 1, and R⁴ is an alkylene group or a partially hydrogenated arylene group. Among the derivatives of Formula III, an especially preferred group are those in which n is 1 and R⁴ is an alkylene group containing not more than about 12 carbon atoms.

(d) those having at least one unit of the formula:

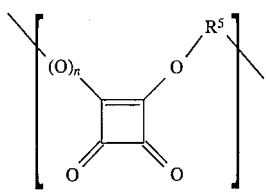

in which n is 0 or 1, and R⁵ is an alkylene or partially hydrogenated arylene group. Besides the fragmentable groups R⁵, the compounds may also contain one or more units in which a non-fragmentable group is attached to a squarate ring, directly or via an oxygen atom.

The squaric acid derivatives of Formula IV include not only high polymers, but also dimers, trimers, tetramers, etc. including at least one of the specified units. The terminating groups on the derivatives of Formula IV may be any of groups OR¹ or R² discussed above with reference to Formula I. Thus, for example, Formula IV includes the squaric acid dimer derivative of the formula:

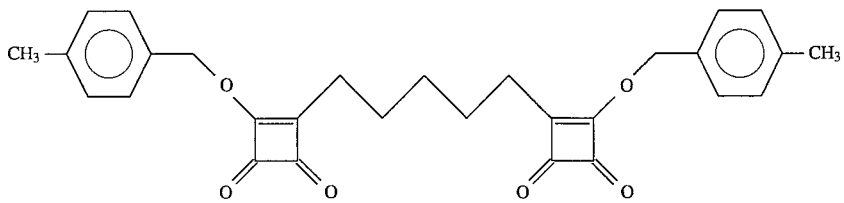

The squaric acid derivatives of Formulae I and II are usually monomeric. However, these derivatives of Formulae I and II can be incorporated into polymers by having at least one of the groups R¹, R² and R³ attached to a polymer. Attachment of the squaric acid derivatives to a polymer in this manner may be advantageous in that it may avoid incompatibility and/or phase separation that might occur between a monomeric squaric acid derivative of Formula I or II and a polymeric binder needed in an imaging medium.

The attachment of the groups R¹, R² and R³ to a polymer may be effected in various ways, which will be familiar to those skilled in the art of polymer synthesis. The squaric acid derivatives may be incorporated into the backbone of a polymer, for example in a polymer similar to the dimer of the formula given above. Alternatively, the squaric acid derivatives may be present as sidechains on a polymer; for example, one of the groups R¹, R² and R³ could contain an amino group able to react with a polymer containing carboxyl groups or derivatives thereof to form an amide linkage which would link the squaric acid derivative as a sidechain on to the polymer, or these groups may contain unsaturated linkages that enable the squaric acid derivatives to be polymerized, either alone or in admixture with other unsaturated monomers.

In the present process, it is generally undesirable to form substantial quantities of gas during the acid-catalyzed decomposition of the secondary acid generator since such gas may distort the imaging medium or form vesicles therein, and such distortion or vesicle formation may interfere with proper image formation. Accordingly, if the decomposition of the squaric acid derivative yields an alkene, it is desirable that the groups R¹, R³, R⁴ and R⁵ be chosen so that this alkene is a liquid at 20° C., and preferably higher, since some heating of the alkene will inevitably occur during the acid-catalyzed decomposition. Sometimes, however, the alkene liberated may be sufficiently soluble in the medium containing the squaric acid derivative that liberation of a highly volatile alkene will not result in distortion of, or vesicle formation in, the medium.

Another preferred group of secondary acid generators for use in the present process are oxalic acid derivatives that undergo acid-catalyzed breakdown to give oxalic acid or an acidic derivative thereof, for example an oxalic acid hemiester. Although oxalic acid and its acidic derivatives are not quite such strong acids as squaric acid and its acidic derivatives, oxalic acid and its derivatives are sufficiently strong acids for use with most image dyes. Also, oxalic acid derivatives are, in general, less costly than squaric acid derivatives.

The types of oxalic acid derivatives preferred for use in the present process are rather more diverse in structure than the squaric acid derivatives, and the choice of oxalic acid derivative for any specific process may be governed more by the thermal breakdown properties of the derivative than its exact chemical structure; in general, for practical reasons such as the limited temperature range to which other components of the imaging medium may safely be exposed, it is preferred that the oxalic acid derivative be one which begins to decompose thermally at a temperature in the range of about 140° to about 180° C., as measured by differential scanning calorimetry in a nitrogen atmosphere at a 10° C./minute temperature ramp, in the absence of any catalyst. Since the presence of an acid catalyst lowers the thermal decomposition temperature of oxalic acid derivatives by at least about 20° C. and potentially significantly more, derivatives which decompose uncatalyzed at about 140° to about 180° C., will, in the presence of acid, decompose at temperatures as low as about 65° C., temperatures to which other components of the imaging medium can in general be exposed.

The factors affecting the ability of the oxalic acid derivatives to undergo acid-catalyzed thermal decomposition are similar to those affecting the ability of the aforementioned squaric acid derivatives to undergo the same reaction, and thus the preferred ester groups are of the same types. Accordingly, preferred oxalic acid derivatives for use in the present process include:

(a) primary and secondary esters of oxalic acid in which the α-carbon atom (i.e., the carbon atom bonded directly to the —O— atom of the oxalate grouping) bears a non-basic cation-stabilizing group. This cation-stabilizing group may be, for example, an $sp^2$ or sp hybridized carbon atom, or an oxygen atom;

(b) tertiary esters of oxalic acid in which the α-carbon atom does not have an $sp^2$ or sp hybridized carbon atom directly bonded thereto; and (c) tertiary esters of oxalic acid in which the α-carbon atom does have an $sp^2$ or sp hybridized carbon atom directly bonded thereto, provided that this $sp^2$ or sp hybridized carbon atom (or at least one of these $sp^2$ or sp hybridized carbon atoms, if more than one such atom is bonded directly to the α-carbon atom) is conjugated with an electron-withdrawing group.

(d) an ester formed by condensation of two moles of an alcohol with the bis(hemioxalate) of a diol, provided that the ester contains at least one ester grouping of types (a), (b) or (c) above. One example of an ester of this type is that of the structure:

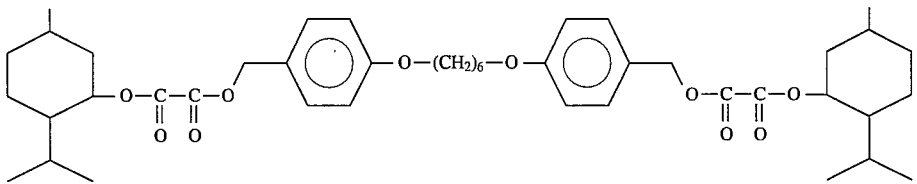

which can be regarded as formed from two moles of menthol (2-methylethyl-4-methylcyclohexanol) and one mole of the bis(hemioxalate) of 1,6-bis-(4-hydroxymethylphenoxy)hexane. Since the structure of the central residue of the diol in such esters can vary widely, the solubility and other properties of the esters can be "tuned" as required for compatibility with other components of the imaging medium, while the nature of the end groups, which undergo the acid-forming thermal decomposition, can be varied independently of the nature of the central residue.

(e) polymeric oxalates derived from polymerization of oxalate esters having an ethylenically unsaturated group, provided that the ester contains at least one ester grouping of type (a), (b) or (c) above. As with the squaric acid derivatives discussed above, use of a polymeric oxalate rather than a monomeric one may be advantageous in that it may avoid incompatibility and/or phase separation that might occur between a monomeric derivative and a polymeric binder needed in an imaging medium. Use of a polymeric derivative also tends to inhibit diffusion of the oxalate through the imaging medium during storage before imaging. Although polymeric oxalates can be formed in other ways, at present we prefer to form such oxalates by first forming an oxalate ester in which one of the ester groupings comprises an ethylenically unsaturated group, and then polymerizing this ester using a conventional free radical polymerization initiator, for example azobis(isobutyronitrile) (AIBN). The ethylenically unsaturated group is conveniently an acrylate or methacrylate group, while the other ester grouping in the monomeric oxalate can be any of the types discussed above.

(f) Condensation polymers of oxalates, provided that the ester contains at least one ester grouping of type (a), (b) or (c) above. This type of polymer also possesses the advantages discussed under (e) above.

Methods for the synthesis of the preferred secondary acid generators described above are given in the aforementioned U.S. Pat. Nos. 5,286,612 and 5,453,345, and International Application No. PCT/US93/10215.

The image dye used in the present invention may be any material that undergoes a color change in the presence of the secondary acid. Thus any conventional indicator dye may be used as the acid-sensitive material, as may the leuco dyes disclosed in U.S. Pat. Nos. 4,602,263; 4,720,449 and 4,826,976, which are also sensitive to acid.

Preferred uses of the indicator sensitizing dye form of the present process include:

(a) the use of visible imagewise exposure to produce a visible image, which may be positive or negative;

(b) a true- or false-sensitized full color image exposed at three different wavelengths (for example, a print paper)

(c) the use of near infra-red (700–1200 nm) radiation to produce a visible image having good $D_{min}$ when viewed in reflection (in this process, the protonated from of the sensitizing dye has a near infra-red absorption peak and the unprotonated form of the dye has a substantially lower visible absorption than the protonated form);

(d) the use of ultra-violet exposure to form an ultra-violet photomask; and (e) the formation of a full color image using a single source (preferably a laser) at a single visible or near infra-red wavelength to effect imagewise exposure of all three acid-generating layers of the medium.

Process (e) above uses an imaging medium of the invention having three associated pairs of acid-generating layers and color-change layers (each pair comprising an acid-generating layer and a color-change layer may hereinafter be called a "bilayer"), with each adjacent pair of bilayers being separated by an acid-impermeable interlayer. This type of imaging medium comprises:

a first acid-generating layer comprising a sensitizing dye in its protonated form, optionally a cosensitizer, a superacid precursor and a secondary acid generator;

a first color-change layer disposed adjacent the first acid-generating layer and comprising a reactive material, a copper compound and a first image dye undergoing a change in its absorption of radiation upon contact with the secondary acid generated upon acid-catalyzed decomposition of the secondary acid generator in the first acid-generating layer;

a first acid-resistant interlayer superposed on the first acid-generating layer and the first color-change layer;

a second acid-generating layer disposed on the opposed side of the first acid-resistant interlayer from the first acid-generating layer and the first color-change layer, the second acid-generating layer comprising a sensitizing dye in its unprotonated form, optionally a consensitizer, a superacid precursor and a secondary acid generator, the second acid-generating layer further comprising a first auxiliary sensitizer which renders the superacid precursor therein susceptible to decomposition by actinic radiation of a first wavelength in the second wavelength range, but not susceptible to decomposition by actinic radiation of a second wavelength in the second wavelength range;

a second color-change layer disposed adjacent the second acid-generating layer and on the opposed side of the first acid-resistant interlayer from the first acid-generating layer and the first color-change layer, the second color-change layer comprising a reactive material, a copper compound and a second image dye undergoing a change in its absorption of radiation upon contact with the secondary acid generated upon acid-catalyzed decomposition of the secondary acid generator in the second acid-generating layer, the absorption change undergone by the second image dye being different from that undergone by the first image dye;

a second acid-resistant interlayer disposed on the opposed side of the second acid-generating layer and second color-change layer from the first acid-resistant interlayer;

a third acid-generating layer disposed on the opposed side of the second acid-resistant interlayer from the second acid-generating layer and second color-change layer, the third acid-generating layer comprising a sensitizing dye in its unprotonated form, optionally a consensitizer, a superacid precursor and a secondary acid generator, the third acid-generating layer further comprising a second auxiliary sensitizer which renders the superacid precursor therein susceptible to decomposition by actinic radiation of the second wavelength in the second wavelength range, but not susceptible to decomposition by actinic radiation of the first wavelength in the second wavelength range; and a third color-change layer disposed adjacent the third acid-generating layer and on the opposed side of the second acid-resistant interlayer from the second acid-generating layer and the second color-change layer, the third color-change layer comprising a reactive material, a copper compound and a third image dye undergoing a change in its absorption of radiation upon contact with the secondary acid generated upon acid-catalyzed decomposition of the secondary acid generator in the third acid-generating layer, the absorption change undergone by the third image dye being different from those undergone by the first and second image dyes. Very conveniently, in this preferred form of imaging medium, the same sensitizing dye, superacid precursor and secondary acid generator are present in each of the three acid-generating layers. The same reactive material and copper compound are also preferably used in each of the three color-forming layers.

This type of imaging medium is imaged in the following manner. First, the medium is imagewise exposed, from the surface closer to the third acid-generating layer, to actinic radiation in the first wavelength range, thereby causing, in the exposed areas of the first acid-generating layer or phase, the sensitizing dye to decompose at least part of the superacid precursor, with formation of unbuffered superacid in the first acid-generating layer, without substantial production of unbuffered superacid in the second and third acid-generating layers. Thereafter, the whole imaging medium is exposed to radiation of the first wavelength in the second wavelength range, thus decomposing part of the superacid precursor in the second acid-generating layer to produce superacid and converting at least part of the sensitizing dye in the second acid-generating layer to its protonated form, without substantial production of superacid in the third acid-generating layer. The medium is then imagewise exposed to actinic radiation in the first wavelength range, thus causing, in the exposed areas of the second acid-generating layer or phase, the sensitizing dye to decompose at least part of the superacid precursor, with formation of unbuffered superacid in the second acid-generating layer, without substantial production of unbuffered superacid in the first and third acid-generating layers. Thereafter, the whole imaging medium is exposed to radiation of the second wavelength in the second wavelength range, thus decomposing part of the superacid precursor in the third acid-generating layer to produce superacid and converting at least part of the sensitizing dye in the third acid-generating layer to its protonated form. The medium is then imagewise exposed to actinic radiation in the first wavelength range, thus causing, in the exposed areas of the third acid-generating layer or phase, the sensitizing dye to decompose at least part of the superacid precursor, with formation of unbuffered superacid in the third acid-generating layer, without substantial production of unbuffered superacid in the first and second acid-generating layers. The last two stages of the imaging process are heating the medium to cause, in the exposed areas of the first, second and third acid-generating layers, acid-catalyzed thermal decomposition of the secondary acid generator and formation of the secondary acid, and admixing the components of the first acid-generating layer with those of the first color-change layer, the components of the second acid-generating layer with those of the second color-change layer, and the components of the third acid-generating layer with those of the third color-change layer, thus causing, in the areas of the medium exposed to the three imagewise exposures, the secondary acids to bring about the changes in absorption of the first, second and third image dyes and thus form a trichrome image, and the copper compound and reactive material to destroy the remaining superacid precursor in each of the three acid-generating layers, thus fixing the image. If the same sensitizing dye is used in each of the three acid-generating layers, all three imagewise exposures can be effected using radiation of the same wavelength (for example, a single laser) thus avoiding, for example, the need for three separate sources of imaging radiation all of which must be scanned across the imaging medium.

Besides the acid-generating and color-change layers or phases, the imaging media of the present invention may comprise a support and additional layers, for example, a subbing layer to improve adhesion to the support, acid-impermeable interlayers (as discussed above) for separating multiple bilayers from one another, an anti-abrasive topcoat layer, and other auxiliary layers.

The support employed may be transparent or opaque and may be any material that retains its dimensional stability at the temperature used for image formation. Suitable supports include paper, paper coated with a resin or pigment, such as, calcium carbonate or calcined clay, synthetic papers or plastic films, such as polyethylene, polypropylene, polycarbonate, cellulose acetate and polystyrene. The preferred material for the support is a polyester, desirably poly(ethylene terephthalate).

Usually the acid-generating and color-change layers or phases will each also contain a binder; typically these layers are formed by combining the active materials and the binder in a common solvent, applying a layer of the coating composition to the support and then drying. Rather than a solution coating, the layer may be applied as a dispersion or an emulsion. The coating composition also may contain dispersing agents, plasticizers, defoaming agents, coating aids and materials such as waxes to prevent sticking.

The binder used for the acid-generating layer(s) must of course be non-basic, such that the superacid is not buffered by the binder. Examples of binders that may be used include styrene-acrylonitrile copolymers, polystyrene, poly($\alpha$-methylstyrene), copolymers of styrene and butadiene, poly(methyl methacrylate), copolymers of methyl and ethyl acrylate, poly(vinyl butyral), polycarbonate, poly(vinylidene chloride) and poly(vinyl chloride). It will be appreciated that the binder selected should not have any adverse effect on the superacid precursor, sensitizer, secondary acid generator, copper compound, reactive material or image dye incorporated therein. Also, the binder should be heat-stable at the temperatures encountered during the heating step and should be transparent so that it does not interfere with viewing of the image. The binder must of course transmit the actinic radiation used in the exposure steps.

The imaging media of the present invention may be used in any of the ways in which the aforementioned '489 and '612 media have been used. Specifically, the imaging media of the present invention are very suitable for use in slide blanks similar to those described in U.S. Pat. Nos. 5,422,230 and 5,451,478 and the corresponding International Applications Nos. PCT/US95/04401 and PCT/US95/04395 respectively.

Thus, one preferred slide blank of the present invention comprises:
a support;
a mask layer having a substantially transparent central portion and a non-transparent peripheral portion surrounding the central portion; and,
an imageable layer comprising an imaging medium of the present invention which is imageable to form an image which can be viewed in transmission,
the support, mask layer and imageable layer being secured together so that the support and the imageable layer extend across essentially the entire transparent central por-

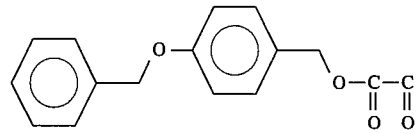

tion of the mask layer, at least the portion of the support adjacent the central portion of the mask layer being substantially transparent.

A second preferred slide blank of the present invention comprises:
a support at least part of which is essentially transparent;
an imageable layer superposed on one face of the support, the imageable layer comprising an imaging medium of the present invention which is imageable to form an image which can be viewed in transmission; and
a protective layer superposed on the imageable layer on the opposed side thereof from the support, at least part of the protective layer being essentially transparent;
the support, imageable layer and protective layer being secured together to form a slide blank having a thickness of at least about 0.8 mm, and the thickness of the protective layer being such that no part of the imageable layer containing the color-forming composition is more than about 0.2 mm from one external surface of the slide blank.

For further details of these preferred slide blanks, methods for their use and slides produced therefrom, the reader is referred to the aforementioned U.S. Pat. Nos. 5,422,230 and 5,451,478, and International Applications Nos. PCT/US95/04401 and PCT/US95/04395.

Figure 3:
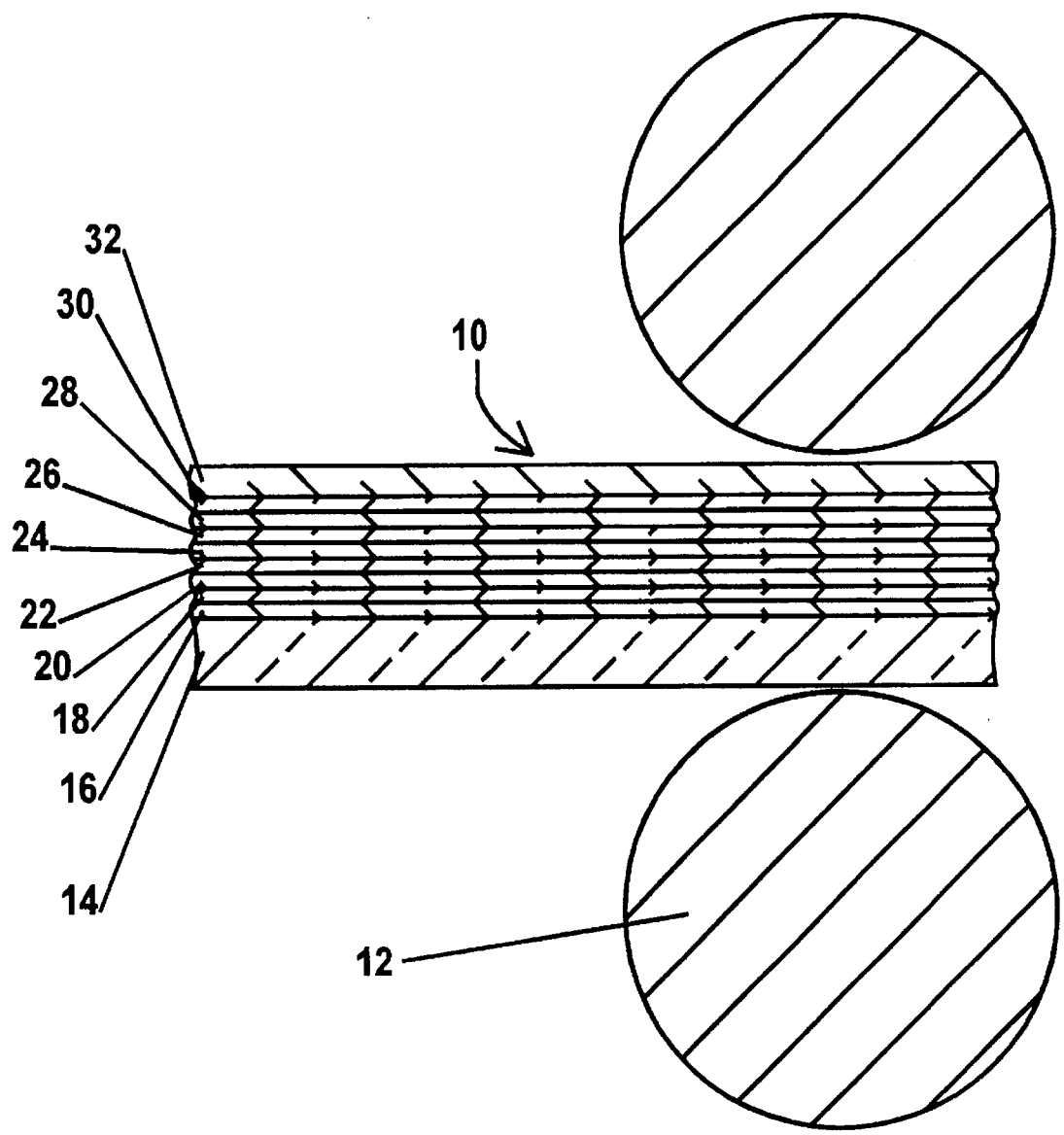
FIG. 3 is a schematic cross-section through an imaging medium of the present invention as it is being passed between a pair of hot rollers during the imaging process of the present invention.

A preferred embodiment of the invention will now be described, though by way of illustration only, with reference to FIG. 3 of the accompanying drawings, which shows a schematic cross-section through a full color imaging medium (generally designated 10) of the invention as the image therein is being fixed by being passed between a pair of hot rollers 12.

The imaging medium 10 comprises a support 14 formed from a plastic film. Typically the support 14 will comprise a polyethylene terephthalate film 3 to 10 mils (76 to 254 mμ) in thickness, and its upper surface (in FIG. 3) may be treated with a sub-coat, such as are well-known to those skilled in the preparation of imaging media, to improve adhesion of the other layers to the support.

On the support 14 is disposed a first acid-generating layer 16 comprising:
(a) a superacid precursor, namely (4-octyloxyphenyl)phenyliodonium hexafluoroantimonate;
(b) an indicator sensitizing dye of the formula:

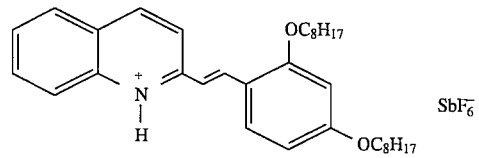

(the unprotonated form is available from Yamada Chemicals, Kyoto, Japan); this sensitizing dye sensitizes the superacid precursor to visible radiation at approximately 450 nm);
(c) a secondary acid generator, which undergoes a superacid-catalyzed thermal decomposition to form a secondary acid, this secondary acid generator being of the formula:

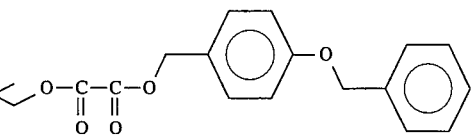

(d) a cosensitizer, preferably triphenylamine; and
(e) a polystyrene binder.

On the opposed side of the acid-generating layer 16 from the support 14 is disposed a first color-change layer 18 comprising:
(a) a first image dye, of the formula:

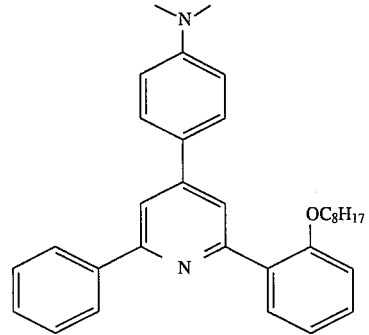

(available from Hilton Davis Co., 2235 Langdon Farm Road, Cincinnati, Ohio 45237 under the tradename "Copikem 37"), which changes from colorless to yellow in the presence of an acid;
(b) copper(II) acetate;
(c) a reactive material, namely potassium acetate; and
(d) a binder comprising Acryloid B-82 (available from Rohm & Haas, Philadelphia, Pa. 19104) and poly(vinyl alcohol); the poly(vinyl alcohol) acts as both a binder and a reducing agent for the fixing process.

The acid-generating layer 16 and the color-change layer 18 both contain a binder having a glass transition temperature substantially above room temperature.

Superposed on the first color-change layer 18 is an acid-impermeable layer 20, which serves to prevent acid generated in the second acid-generating layer 22 (see below)

during imaging penetrating to the first color-change layer 18. Superposed on the acid-impermeable layer 20 is a second acid-generating layer 22, which contains the same superacid precursor, secondary acid generator and binder as the first acid-generating layer 16. However, the second acid-generating layer 22 contains, in its protonated form, as an indicator sensitizing dye, 2,4,6-tris(2,4-dimethoxyphenyl)pyridine, which sensitizes the superacid precursor to visible/near ultra-violet radiation of approximately 400 nm wavelength.

Superposed on the second acid-generating layer 22 is a second color-change layer 24 which is identical to the first color-change layer, except that the Copikem 37 is replaced by a second image dye, of the formula:

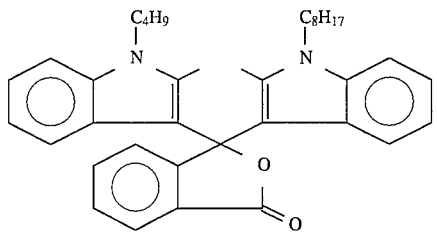

(available from Hilton Davis Co. under the tradename "Copikem 35"), which changes from colorless to magenta in the presence of an acid.

The next layer of the imaging medium is a second acid-impermeable interlayer 26, identical to the layer 20. Superposed on the acid-impermeable layer 26 is a third acid-generating layer 28, which contains the same superacid precursor, secondary acid generator and binder as the first and second acid-generating layers 16 and 22 respectively. However, this third acid-generating layer 28 does not contain an indicator sensitizing dye, but instead contains a conventional non-basic polycyclic aromatic sensitizer, namely 1-vinylpyrene, which sensitizes the superacid precursor to ultra-violet radiation of approximately 350 nm wavelength. Superposed on the third acid-generating layer 28 is a third color-change layer 30 which is identical to the first color-change layer, except that the Copikem 37 is replaced by a third image dye, of the formula:

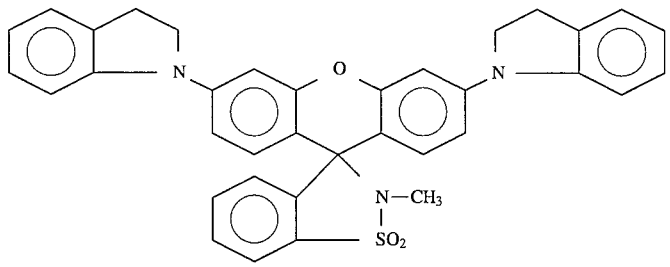

(see U.S. Pat. No. 4,345,017) which changes from colorless to cyan in the presence of an acid. Finally, the imaging medium 10 comprises an abrasion-resistant topcoat 32.

The imaging medium 10 is exposed by writing on selected areas of the medium with three radiation sources having wavelengths of 450, 400 and 350 nm respectively. The three radiation sources may be applied simultaneously or sequentially; for example, the medium may be scanned in a raster pattern simultaneously by the focused beams from three lasers of appropriate wavelengths, or the medium may be exposed sequentially through three masks to radiation from lamps generating radiation of appropriate wavelengths. The 450 nm radiation, which carries the yellow channel of the desired image, images the first acid-generating layer 16, the 400 nm radiation, which carries the magenta channel, images the second acid-generating layer 22 and the 350 nm radiation, which carries the cyan channel, images the third acid-generating layer 28. Thus, as described above with reference to FIGS. 2A–2D, since the sensitizing dyes in the first and second acid-generating layers 16 and 22 respectively are present in protonated form (i.e., these two layers are, prior to imaging, as shown in FIG. 2A, except that all the sensitizing dye, not merely 75%, is present in protonated form), latent images in unbuffered superacid are formed in the first and second acid-generating layers 16 and 22. A latent image in unbuffered superacid is also present in the third acid-generating layer 28, since the vinylpyrene sensitizer used in this layer does not buffer the superacid produced by decomposition of the superacid precursor.

The imaging medium 10 is passed between the heated rollers 12; the heat applied by these rollers causes the unbuffered superacid present in the exposed areas of the acid-generating layers 16, 22 and 28 to cause catalytic breakdown of the secondary acid generator therein, thus causing formation of a quantity of secondary acid substantially greater than the quantity of unbuffered superacid generated by the imagewise exposures. The heat and pressure applied by the heated rollers 12 also raise the acid-generating layers 16, 22 and 28 and the color-change layers 18, 24 and 30 above their glass transition temperatures, thus causing the components present in each acid-generating layer to intermix with the components present in its associated color-change layer. Accordingly, the three associated pairs of acid-generating and color-change layers are "developed" and fixed as described above with reference to Table 2; i.e., the copper compound decomposes the remaining superacid precursor and the base neutralizes the unbuffered superacid present. In these exposed areas, the secondary acid produced in the acid-generating layer effects the color change of the image dye in the associated color-change layer, thereby forming yellow, magenta and cyan images in the layers 18, 24 and 30. In the non-exposed areas, excess base remains and the image dye remains uncolored. The acid-impermeable interlayers 20 and 26 prevent the unbuffered superacid or the secondary acid generated in the second and third acid-generating layers 22 and 28 respectively migrating to the first and second color-change layers 18 and 24 respectively, thus preventing crosstalk among the three images. The mixing of the components present in each bilayer also causes the base present in each of the color-change layers to deprotonate the protonated forms of the sensitizing dye (in the layers using indicator sensitizing dye) present in the non-exposed areas of its associated acid-generating layer, thus removing the visible absorption due to the protonated sensitizing dye, and reducing the $D_{min}$ of the images to a low level.

The following Examples are now given, though by way of illustration only, to show details of preferred reagents, conditions and techniques for use in the process and medium of the present invention.

Examples 1–3: Nucleophile/Redox Catalyst Process

Example 1

This example uses high pressure liquid chromatographic (HPLC) analysis of extracted films to show that complete destruction of an iodonium salt superacid precursor may be achieved, in both exposed and non-exposed areas of an imaging medium of the present invention, by thermal reaction in the presence of a copper reagent. In the absence of the copper reagent, iodonium salt remains undestroyed in both $D_{min}$ and $D_{max}$ areas.

The acid-generating and color-change layers used were coated from organic solvents onto separate pieces of film base. The reactive material used in the color-change layer was a tertiary amine, which acts as both a base and a reducing agent. After exposure and heating of the acid-generating layer, the two film bases were laminated together and heated, thereby mixing the components in the acid-generating layer and the color-change layer.

Three coating fluids were prepared as follows:

Fluid A

A superacid precursor ((4-octyloxyphenyl)phenyl iodonium hexafluoroantimonate, 0.25 g), a sensitizer (1-vinylpyrene, 0.1 g), a secondary acid generator (2,2-dimethyl-1-[4-methoxybenzyloxalyloxy]prop-3-yl[4-methoxybenzyl] oxalate, prepared as described in the aforementioned U.S. Pat. No. 5,453,345, 4 g) and a polymeric binder (poly(methyl methacrylate), Elvacite 2021, supplied by DuPont de Nemours, Wilmington, Del., 6 g) were dissolved in dichloromethane (114 g). Surfactant FC-431 (available from Minnesota Mining and Manufacturing Corporation, St. Paul, Minn., 1.86 mL of a 2% solution in methyl ethyl ketone (MEK)) was added to the resulting solution.

Fluid B

A magenta indicator dye (3,3-bis[1-butyl-2-methyl-1H-indol-3-yl]-1-(3H)-isobenzofuranone, available under the tradename Copikem 20 from Hilton Davis Co., 6 g), a hindered amine base (Tinuvin 292, available from Ciba-Geigy Additives Division, Seven Skyline Drive, Hawthorne, N.Y. 10532, 0.75 g), a polymeric binder (the aforementioned Elvacite 2021, 7.5 g) and a surfactant (Aerosol TR-70, supplied by American Cyanamid Co., Wayne, N.J. 07470, with pH adjusted to 6.4 using a 1M aqueous solution of sodium hydroxide, 1.02 g) were dissolved in dichloromethane (159 g, 120 mL).

Fluid C

Copper(II) acetylacetonate (130 mg), and the same magenta indicator dye (0.4 g), hindered amine base (50 mg), polymeric binder (0.5 g) and surfactant (68 mg) as in Fluid B were dissolved in dichloromethane (10.6 g, 8.0 mL).

Experimental Procedure

Fluid A was coated onto a reflective film base of 6 mil thickness (Melinex film, available from ICI Americas, Inc., Wilmington Del.) using a #12 coating rod, to form Coating A. Fluids B and C were separately coated onto pieces of poly(ethylene terephthalate) base (ICI Type 3295) of 4 mil (101 micron) thickness using a #4 coating rod, to form Coatings B and C, respectively.

The resultant coatings were treated as described below in Experiments A–E:

Experiment A: Exposure and processing to give $D_{max}$, with no fixing reagent in the color-change layer, followed by extraction and HPLC analysis.

A portion of Coating A, 125 cm$^2$ in area, was treated as follows:

(i) Exposed to 40 mJ/cm$^2$ ultraviolet irradiation using a nuArc 26-1K Mercury Exposure System (available from nuArc Company, Inc., 6200 West Howard Street, Niles Ill. 60648: the output of this device was measured using an IL390A "Light Bug" radiometer, available from International Light, Inc., 17 Graf Road, Newburyport, Mass. 01950);

(ii) Heated at 120° C. for 30 seconds; and (iii) Laminated to a 125 cm$^2$ piece of Coating B at 120° C., 60 psig and 10 ft/min.

(iv) The laminated structure from (iii) above was heated at 120° C. for 30 seconds;

(v) The laminated structure was next cut into small pieces, placed in a brown glass bottle and extracted with dichloromethane (enough to cover the pieces of film) for 1 hour at room temperature. The film base was removed, and the remaining solution evaporated. The residue was dissolved in acetonitrile (HPLC grade, 3 mL; during this process the polymer precipitated) and the resultant solution was filtered through a 0.45 micron disposable filter; and (vi) Filtered acetonitrile extracts from (v) above were analyzed by HPLC, using a Hewlett-Packard 1090 HPLC instrument equipped with a diode array UV-vis detector, a Rainin RP-18 pre-column and a Keystone Scientific Spherisorb ODS2 column (150×4.6 mm, 5 micron particle size), eluted as follows:

Eluting solvents:

X. An aqueous solution, 200 mM in hexanesulfonic acid, sodium salt, and 40 mM in triethylamine, adjusted to pH 3.5 with phosphoric acid;

Y. 1:1 acetonitrile/methanol.

Elution gradient:

0 min 1:4 X:Y 5 min 1:8 X:Y 10 min 100% Y

Flow rate: 1.2 mL/min

Detection 254 nm

Reference: 450 nm

Injection volume: 25 microliters.

Under these conditions, the retention time of the superacid precursor (4-octyloxyphenyl)phenyl iodonium hexafluoroantimonate was 5.2 minutes. The integration of this peak was recorded. Calibration experiments showed that the area under this peak was proportional to the concentration of (4-octyloxyphenyl)phenyl iodonium hexafluoroantimonate in acetonitrile solution.

Experiment B: Exposure and processing to give $D_{max}$, with copper(II) acetylacetonate fixing reagent in the color-change layer, followed by extraction and HPLC analysis.

Coating A (125 cm$^2$) was treated as in Experiment A above, except that film C (125 cm$^2$) was used instead of film B in step (iii).

Experiment C: Processing without exposure, to give $D_{min}$, with no fixing reagent in the color-change layer, followed by extraction and HPLC analysis.

Coating A (125 cm$^2$) was treated as in Experiment A above, omitting step (i).

Experiment D: Processing without exposure, to give $D_{min}$, with copper(II) acetylacetonate fixing reagent in the color-change layer, followed by extraction and HPLC analysis.

Coating A (125 cm$^2$) was treated as in Experiment A above, omitting step (i), and using film C (125 cm$^2$) instead of film B in step (iii).

Experiment E: Extraction and HPLC analysis of the color-change layer without exposure or processing.

Coating A (125 cm$^2$) was analyzed by the process of steps (v) and (vi) in Experiment A above.

The results from these experiments are shown in Table 3 below.

TABLE 3

| Experiment | A $D_{max}$ no Cu | B $D_{max}$ +Cu | C $D_{min}$ no Cu | D $D_{min}$ +Cu | E No exposure |
|---|---|---|---|---|---|
| Area of HPLC peak at 5.2 minutes retention time (arbitrary units) | 2388 | 0 | 4839 | 0 | 4833 |
| Remaining iodonium salt (%) | 49 | 0 | 100 | 0 | 100 |

These experiments clearly show that, in the presence of the copper(II) fixing reagent, all the iodonium salt is destroyed the $D_{min}$ and $D_{max}$ areas under the imaging conditions described above, whereas without the copper reagent, iodonium salt remains in both $D_{min}$ and $D_{max}$ areas.

Example 2

This example shows that the $D_{min}$ of a single-sheet imaging medium can be rendered light-stable by incorporation of a copper reagent into the color-change layer. It is also shown that an initially lower $D_{min}$, and higher image contrast, may be obtained by use of a primary amine rather than a tertiary amine.

Four dispersions were prepared as follows:

Dispersion A

A magenta indicator dye (3-[1-butyl-2-methylindol-3-yl]-3-[1-octyl-2-methylindol-3-yl]-1-(3H)-isobenzofuranone, available under the tradename Copikem 35, from Hilton Davis Co., 2 g), a hindered amine base (Tinuvin 292, 0.5 g), an acrylate polymeric binder (Elvacite 2043, supplied by Du Pont de Nemours, Wilmington, Del., 2.5 g) and a surfactant (Aerosol TR-70 with pH as in Example 1, 0.34 g) were dissolved in dichloromethane (40 mL). De-ionized water (40 g) was added, and the mixture was sonicated. The mixture became initially very viscous; sonication was continued, with addition of additional water (ca. 8 mL), until a marked reduction in viscosity was observed. Finally, evaporation of dichloromethane afforded Dispersion A (10.0% solid materials in water).

Dispersion B

A primary amine base (2-aminoethylimidazolidone, 0.25 g), and the same magenta indicator dye (1.0 g), , binder (1.25 g) and surfactant (0.17 g) as in Dispersion A were dissolved in dichloromethane (20 mL). De-ionized water (20 g) was added, and the mixture was sonicated. The mixture became initially very viscous; sonication was continued, with addition of additional water (ca. 4 mL), until a marked reduction in viscosity was observed. Finally, evaporation of dichloromethane afforded Dispersion B (10.2% solid materials in water).

Dispersion C

Copper(II) ethylacetoacetate (90 mg), and the same binder (1.5 g) and surfactant (0.204 g) as in Dispersion A were dissolved in dichloromethane (25 mL). De-ionized water (24 g) was added, and the mixture was sonicated. The mixture became initially very viscous; sonication was continued until a marked reduction in viscosity was observed. Finally, evaporation of dichloromethane afforded Dispersion C (8.05% solid materials in water).

Dispersion D

A polyacrylate binder (Elvacite 2043, 45.0 g) and a surfactant (TR-70, with pH as in Example 1, 3.0 g) were dissolved in dichloromethane (307 g.). De-ionized water (280 g) was added, and the mixture was homogenized. Evaporation of dichloromethane gave Dispersion D (13.8% solid materials in water).

Five coating fluids were also prepared as follows:

Fluid A

A superacid precursor ((4-octyloxyphenyl)phenyl iodonium hexafluoroantimonate, 50 mg), a sensitizer (1-vinylpyrene, 40 mg), a secondary acid generator (2,2-dimethyl-1-[4-benzyloxybenzyloxalyloxy]prop-3-yl[4-benzyloxybenzyl]oxalate (prepared as described in the aforementioned U.S. Pat. No. 5,453,345, 200 mg), a polystyrene binder (average molecular weight 45,000, available from Aldrich Chemical Co., Milwaukee, Wis., 400 mg) and a surfactant (FC-431, (available from Minnesota Mining and Manufacturing Corporation, St. Paul, Minn., 10 mg of a 2% solution in MEK) were dissolved, with warming, in sufficient 2-butanone to bring the total weight of the solution to 7.0 g.

Fluid B1

Dispersion A (1.0 g) was combined with 2.0 g of dispersion D, 0.38 g of a 9.9% aqueous solution of poly(vinyl alcohol) (Vinol 540, available from Air Products Corporation, Allentown, Pa.) and a surfactant (FC-120, available from Minnesota Mining and Manufacturing Corporation, St. Paul, Minn., 0.03 mL of a 10% solution in 2-butanone).

Fluid B2

Dispersion A (1.0 g) was combined with 2.0 g of dispersion C, and the same amounts of Vinol 540 and FC-120 as in Fluid B1.

Fluid B3

Dispersion B (1.0 g) was combined with 2.0 g of dispersion D, and the same amounts of Vinol 540 and FC-120 as in Fluid B1.

Fluid B4

Dispersion B (1.0 g) was combined with 2.0 g of dispersion C, and the same amounts of Vinol 540 and FC-120 as in Fluid B1.

Experimental Procedure

An acid-generating layer was formed by coating Fluid A (pre-heated to about 50° C.) onto reflective Melinex base of 6 mol thickness with a #5 coating rod.

Four different color-change layers were coated on to separate pieces of this film by coating Fluids B1, B2, B3 and B4, using a #8 coating rod.

The resultant structures, A/B1, A/B2, A/B3 and A/B4 respectively, had the estimated coverages (in micrograms/cm$^2$) shown in Table 4:

TABLE 4

| Structure | A/B1 | A/B2 | A/B3 | A/B4 |
|---|---|---|---|---|
| Iodonium salt | 10.9 | 10.9 | 10.9 | 10.9 |
| Secondary acid | 44.0 | 44.0 | 44.0 | 44.0 |

TABLE 4-continued

| Structure | A/B1 | A/B2 | A/B3 | A/B4 |
|---|---|---|---|---|
| generator | | | | |
| Sensitizer | 8.8 | 8.8 | 8.8 | 8.8 |
| Image Dye | 21.8 | 21.8 | 21.8 | 21.8 |
| Primary Amine | 0 | 0 | 5.5 | 5.5 |
| Tertiary Amine | 5.5 | 5.5 | 0 | 0 |
| Copper salt | 0 | 4.7 | 0 | 4.7 |

Portions of these four structures were exposed to ultraviolet radiation in the same way as in Example 1 but at an exposure of 21 mJ/cm$^2$, with other portions remaining unexposed. The structures were then heated, first at 65° C. for 20 seconds, and finally at 120° C. for 30 seconds. Optical densities (green) were then recorded in $D_{max}$ (exposed) and $D_{min}$ (non-exposed) areas using an X-Rite 310 photographic densitometer, supplied by X-Rite Inc., Grandville, Mich., with the appropriate filter (Status A).

Portions of the $D_{min}$ and $D_{max}$ areas of the imaged structures were then mounted in slide mounts and exposed to intense light in the gate of an Ektagraphic III slide projector (available from Eastman Kodak) equipped with a 300 W Sylvania tungsten halogen lamp (available from GTE Products Corporation, Winchester, Ky.) for 1 minute. The coated side of the film base was arranged to face the projector lamp. After this exposure, optical densities (green) were again measured in $D_{min}$ and $D_{max}$ areas.

Results from these experiments are shown in Table 5 below, in which "PA denotes the primary amine and "TA" denotes tertiary amine, and "exposure" refers to exposure in the projector.

TABLE 5

| Structure | A/B1 No Cu/TA | A/B2 Cu/TA | A/B3 No Cu/PA | A/B4 Cu/PA |
|---|---|---|---|---|
| $D_{min}$ before exposure | 0.11 | 0.36 | 0.11 | 0.12 |
| $D_{min}$ after exposure | 0.36 | 0.35 | 0.51 | 0.17 |
| $D_{min}$ change during exposure | 0.25 | −0.01 | 0.40 | 0.05 |
| $D_{max}$ before exposure | 0.95 | 1.17 | 0.93 | 1.09 |
| $D_{max}$ after exposure | 0.99 | 1.07 | 0.97 | 1.03 |
| $D_{max}$ change during exposure | 0.04 | −0.1 | 0.04 | −0.06 |

In structures A/B1 and A/B3, in which the copper reagent was not present, $D_{min}$ rose substantially during light exposure. In structures A/B2 and A/B4, in each of which the copper reagent was present, the rise in $D_{min}$ was much reduced or eliminated. In structure A/B4, in which a primary amine was used as the basic component, initial $D_{min}$ was much lower, and contrast was higher than in structure A/B2, in which a tertiary amine was used.

$D_{max}$ was not affected as substantially as $D_{min}$. However, $D_{max}$ rose slightly in structures A/B1 and A/B3, without the copper reagent, but fell slightly in structures A/B2 and A/B4, which incorporated the copper reagent. (The fall in $D_{max}$ is probably due to photolytic instability of the image dye itself in the presence of the other permanent components of the imaging system.)

Example 3

This example illustrates the use of a copper salt and potassium acetate base to produce a fixed image having excellent contrast.

Two coating fluids were prepared as follows:

Fluid A

The same superacid precursor (20 mg) and secondary acid generator (80 mg) as in Example 1, the same polystyrene binder (800 mg of a 20% solution in 2-butanone) as in Example 2, Fluid A, and a sensitizer (9,10-diphenylanthracene, 16 mg), were combined (heating to about 50° C. was required).

Fluid B

The same Copikem 35 magenta indicator dye as in Example 2, Dispersion A (10.0 g) was added to a solution of an acrylate polymeric binder (Acryloid B-82, supplied by Rohm & Haas Corporation, Philadelphia, Pa. 19104, 12.5 g) dissolved in ethyl acetate (77.5 g), and the resultant solution was added to 31.8 g of a 9.81% aqueous solution of the same Vinol 540 poly(vinyl alcohol) as used in Example 2, Fluids B1–B4, to which 73 g of water had been added. The resultant mixture was sonicated, after which evaporation of ethyl acetate afforded the required dispersion (which was diluted with water to 17.0% solids by weight).

To 0.5 g of this dispersion was added 50 mg of a 20% aqueous solution of potassium acetate, 200 mg of an aqueous solution which was 0.71% in copper(II) acetate and 0.62% in poly(vinyl alcohol) (Vinol 540), and 10 mg of a 5% solution of a surfactant (Igepal CO-630, available from GAF Corporation, 1361 Alps Road, Wayne N.J. 07470).

An imaging medium was prepared by first coating Fluid A (preheated to about 50° C.) on to reflective Melinex base of 4 mil (101 μm) thickness using a #4 coating rod, then coating Fluid B on to this dried layer, using a #3 coating rod. This imaging medium was exposed, at the exposures shown in Table 6 below, to ultraviolet radiation using the same apparatus as in Example 1 and a neutral density filter. After exposure, the medium was heated first at 45° C. for 20 seconds, then at 120° C. for 1 minute, and the green optical densities were recorded using an X-Rite 310 photographic densitometer, supplied by X-Rite Inc., Grandville, Mich., with the appropriate filter (Status A).

Finally, the exposed and processed imaging medium was tested for light stability by exposure to fluorescent lamp illumination (2000 ft candles) for the periods of time shown in Table 6, following which the green optical densities were again read. The results obtained are shown in Table 6 below, in which "OD" denotes optical density.

TABLE 6

| Exposure (mJ/cm$^2$) | 50.5 | 27.8 | 14.4 | 7.0 | 4.3 | 1.8 | 0 |
|---|---|---|---|---|---|---|---|
| Initial OD | 1.94 | 1.97 | 1.84 | 1.83 | 1.81 | 0.33 | 0.08 |
| OD after 40 min. fluorescent exposure | 1.98 | 1.99 | 1.87 | 1.89 | 1.80 | 0.65 | 0.09 |
| OD after 16.5 hour fluorescent exposure | 1.84 | 1.89 | 1.80 | 1.81 | 1.76 | 0.87 | 0.11 |

From Table 6, it will be seen that, except for the step having density intermediate between $D_{min}$ and $D_{max}$ obtained upon 1.8 mJ/cm$^2$ irradiation, fixation of the image was achieved. Since this medium was designed to be essentially binary, the lack of stability of intermediate densities was not important.

Examples 4–5: Simple Nucleophile Process

Example 4

This Example illustrates the use of acetate salts of monovalent metals as fixing reagents in the simple nucleophile process of the present invention.

Coating fluids were prepared as follows:

Fluid A

A superacid precursor ((4-octyloxyphenyl)phenyl iodonium hexafluoroantimonate, 32 mg), a sensitizer (9,10-diphenylanthracene, 50 mg) and a secondary acid generator (1-[4-benzyloxybenzyloxalyloxy]-1-methylprop-3-yl[4-benzyloxybenzyl]oxalate (prepared in a manner analogous to that described in U.S. Pat. No. 5,395,736, 252 mg) were dissolved in a solution of polystyrene (average molecular weight 45,000, available from Aldrich Chemical Co., Milwaukee, Wis., 4 g of a 20% w/w solution in 2-butanone).

Fluids B0–B5

A dispersion of Copikem 35 magenta indicator dye was prepared as described in Example 3 above. The final dispersion was 15.08% solids by weight.

Portions of this dispersion (0.5 g) were combined with 0.11 g of 1M solutions of the following acetate salts to make coating fluids B0–B5:

Fluid B0 No acetate salt solution was added (control)

Fluid B1 Ammonium acetate

Fluid B2 Lithium acetate

Fluid B3 Sodium acetate

Fluid B4 Potassium acetate

Fluid B5 Cesium acetate.

An acid-generating layer was formed by coating Fluid A (pre-heated to about 50° C.) on to reflective Melinex base of 5 mil thickness with a #4 coating rod.

Six different color-change layers were coated on to separate pieces of the film bearing the acid-generating layer by coating Fluids B0–B5, using a #3 coating rod.

The resultant imaging media, hereinafter called "A/B0" to "A/B5" were each separately treated as follows:

1. The medium was cut into six pieces.
2. Each of the six pieces was heated at 45° C. for 20 seconds.
3. Each of the six pieces was heated for a different length of time (between 10 and 60 seconds) at 120° C.
4. Each of the six pieces was exposed to a single strobe flash from a Polatronic photographic flash unit (model 2350) from which the ultraviolet filter had been removed. The casing of the lamp was placed in contact with the film, such that the distance between the flash lamp and the film was approximately 3.2 cm.
5. Optical densities (green) were recorded using an X-Rite 310 photographic densitometer, supplied by X-Rite, Inc., Grandville, Mich., with Status A filter.

In a separate experiment, imaging media A/B0–A/B5 were prepared as described above and half of each medium was exposed to 25 mJ/cm² of ultra-violet irradiation using the same type of mercury exposure system as in Example 1 above. The other half of the medium was not exposed. Thereafter, the media were heated at 45° C. for 20 seconds, then at 120° C. for 30 seconds. Finally, the maximum and minimum green optical densities were measured in the same way as in Example 2 above.

The results from these experiments are shown in Table 7 below.

TABLE 7

| Time at 120° C. (sec.) | Control | NH4Ac | LiOAc | NaOAc | KOAc | CsOAc |
| --- | --- | --- | --- | --- | --- | --- |
| $D_{min}$ after heating and flash exposure | | | | | | |
| 10 | 0.93 | 0.96 | 0.9 | 0.8 | 0.47 | 0.93 |
| 20 | 1.02 | 0.97 | 0.76 | 0.67 | 0.27 | 0.23 |
| 30 | 1.02 | 0.92 | 0.7 | 0.61 | 0.11 | 0.12 |
| 40 | 1.01 | 0.85 | 0.63 | 0.56 | 0.13 | 0.09 |
| 50 | 0.99 | 1.35 | 0.67 | 0.57 | 0.11 | 0.08 |
| 60 | 0.96 | 0.88 | 0.76 | 0.56 | 0.08 | 0.08 |
| $D_{min}$ after heating for 30 seconds at 120° C. | | | | | | |
|  | 0.28 | 0.15 | 0.11 | 0.09 | 0.08 | 0.08 |
| Change in $D_{min}$: (heating 60 seconds + flash) − (heating for 30 seconds alone) | | | | | | |
|  | 0.68 | 0.73 | 0.65 | 0.47 | 0 | 0 |
| $D_{max}$ after heating for 30 seconds at 120° C. | | | | | | |
|  | 2.25 | 2.35 | 1.56 | 1.71 | 1.72 | 2.20 |

From Table 7, it will seen that potassium and cesium acetates gave $D_{min}$ values which did not rise as a result of flash exposure after fixing (i.e., these fixing reagents fully fixed the images). In each case, fixing was achieved with 30–60 seconds heating at 120° C., and high contrast imaging was provided.

Example 5

This Example illustrates the use of cesium salts as fixing reagents in the simple nucleophile process of the present invention.

Coating fluids were prepared as follows:

Fluid A

A superacid precursor ((4-(2-hydroxytetradecan-1-yloxy)phenyl)phenyl iodonium hexafluoroantimonate, 50 mg), and the same sensitizer (50 mg) and secondary acid generator (150 mg) as used in Example 4 above were dissolved in a solution of the same polystyrene as used in Example 4 (5 g of a 20% w/w solution in 2-butanone).

Fluids B0–B7

The same Copikem 35 magenta image dye (10 g) as described in Example 2 above was added to a solution of 20 g of the same polystyrene as used to prepare Fluid A in 112 g of ethyl acetate, and the resultant solution was added to a solution of the same Vinol 540 poly(vinyl alcohol) as used in Example 2 (84.08 g of a 6.6% solution in water). Water (155.92 g) was added, and the resultant mixture was sonicated. Evaporation of ethyl acetate yielded the required aqueous dispersion of the dye and polymer (237 g, 14.4% solids by weight).

Portions of this dispersion (0.5 g) were combined with 0.1 g of 1M solutions of the following cesium salts (except for fluid B3, in which 0.5 g of the dispersion was combined with 0.4 g of a 0.25M solution of cesium benzoate) to make coating fluids B0–B7:

Fluid B0 No cesium salt solution was added (control)

Fluid B1 Cesium hydroxide

Fluid B2 Cesium acetate

Fluid B3 Cesium benzoate

Fluid B4 Cesium phenoxide

Fluid B5 Cesium fluoride

Fluid B6 Cesium chloride

Fluid B7 Cesium iodide.

An acid-generating layer was formed by coating Fluid A (pre-heated to about 50° C.) on to reflective Melinex base of 5 mil thickness with a #8 coating rod.

Eight different color-change layers were coated on to separate pieces of the film bearing the acid-generating layer by coating Fluids B0–B7, using a #8 coating rod, except for Fluid B3, which was coated with a #12 rod.

The resultant imaging media, hereinafter called "A/B0" to "A/B7" were each separately treated as follows:

1. Half of each medium was exposed to 25 mJ/cm$^2$ of ultra-violet irradiation using the same type of mercury exposure system as in Example 1 above. The other half of the medium was not exposed.
2. The medium was cut into seven strips, each having an exposed and an unexposed portion.
3. Each of the seven strips was heated at 60° C. for 30 seconds.
4. Each of the seven strips was heated for a different length of time (between 15 and 120 seconds) at 120° C.
5. Optical densities (green) were recorded in exposed and unexposed portions in the same manner as in Example 2 above.
6. The strips were exposed to fluorescent lights (2000 ft. candles) for 20 minutes.
7. Optical densities (green) were again recorded in exposed and unexposed portions in the same manner as before.

The results obtained are shown in Table 8 below:

TABLE 8

| Time at 120° C. (sec.) | 15 | 30 | 45 | 60 | 75 | 90 | 120 |
| --- | --- | --- | --- | --- | --- | --- | --- |
| Control (no cesium salt) | | | | | | | |
| $D_{min}$ before flood | 0.48 | 0.48 | 0.47 | 0.44 | 0.47 | 0.49 | 0.46 |
| $D_{min}$ after flood | 0.80 | 0.81 | 0.76 | 0.77 | 0.87 | 0.88 | 0.83 |
| Difference | 0.32 | 0.33 | 0.29 | 0.33 | 0.40 | 0.39 | 0.37 |
| $D_{max}$ before flood | 1.81 | 2.02 | 1.98 | 1.82 | 1.9 | 1.96 | 1.85 |
| $D_{max}$ after flood | 1.82 | 2.00 | 1.94 | 1.84 | 1.89 | 1.94 | 1.86 |
| Difference | 0.01 | −0.02 | −0.04 | 0.02 | −0.01 | −0.02 | 0.01 |
| Cesium hydroxide | | | | | | | |
| $D_{min}$ before flood | 0.19 | 0.08 | 0.07 | 0.07 | 0.07 | 0.08 | 0.07 |
| $D_{min}$ after flood | 0.63 | 0.44 | 0.24 | 0.14 | 0.10 | 0.08 | 0.07 |
| Difference | 0.44 | 0.36 | 0.17 | 0.07 | 0.03 | 0 | 0 |
| $D_{max}$ before flood | 1.62 | 1.79 | 1.70 | 1.60 | 1.59 | 1.58 | 1.37 |
| $D_{max}$ after flood | 1.61 | 1.78 | 1.73 | 1.58 | 1.59 | 1.61 | 1.40 |
| Difference | −0.01 | −0.01 | 0.03 | −0.02 | 0 | 0.03 | 0.03 |
| Cesium acetate | | | | | | | |
| $D_{min}$ before flood | 0.10 | 0.07 | 0.07 | 0.07 | 0.07 | 0.07 | 0.07 |
| $D_{min}$ after flood | 0.50 | 0.46 | 0.39 | 0.27 | 0.20 | 0.16 | 0.10 |
| Difference | 0.40 | 0.39 | 0.32 | 0.20 | 0.13 | 0.09 | 0.03 |
| $D_{max}$ before flood | 1.45 | 1.55 | 1.53 | 1.48 | 1.47 | 1.46 | 1.42 |
| $D_{max}$ after flood | 1.49 | 1.59 | 1.60 | 1.58 | 1.59 | 1.51 | 1.43 |
| Difference | 0.04 | 0.04 | 0.07 | 0.10 | 0.12 | 0.05 | 0.01 |
| Cesium benzoate | | | | | | | |
| $D_{min}$ before flood | 0.10 | 0.07 | 0.07 | 0.07 | 0.07 | 0.07 | 0.07 |
| $D_{min}$ after flood | 0.57 | 0.25 | 0.19 | 0.17 | 0.13 | 0.10 | 0.11 |
| Difference | 0.47 | 0.18 | 0.12 | 0.10 | 0.06 | 0.03 | 0.04 |
| $D_{max}$ before flood | 1.70 | 1.66 | 1.77 | 1.55 | 1.50 | 1.46 | 1.29 |
| $D_{max}$ after flood | 1.69 | 1.70 | 1.81 | 1.58 | 1.53 | 1.44 | 1.33 |
| Difference | −0.01 | 0.04 | 0.04 | 0.03 | 0.03 | −0.02 | 0.04 |
| Cesium phenoxide | | | | | | | |
| $D_{min}$ before flood | 0.13 | 0.07 | 0.07 | 0.07 | 0.07 | 0.07 | 0.07 |
| $D_{min}$ after flood | 0.56 | 0.27 | 0.21 | 0.10 | 0.08 | 0.08 | 0.08 |
| Difference | 0.43 | 0.20 | 0.14 | 0.03 | 0.01 | 0.01 | 0.01 |
| $D_{max}$ before flood | 1.54 | 1.46 | 1.64 | 1.56 | 1.39 | 1.40 | 1.36 |
| $D_{max}$ after flood | 1.52 | 1.40 | 1.61 | 1.62 | 1.41 | 1.37 | 1.38 |
| Difference | −0.02 | −0.06 | −0.03 | 0.06 | 0.02 | −0.03 | 0.02 |
| Cesium fluoride | | | | | | | |
| $D_{min}$ before flood | 0.21 | 0.07 | 0.07 | 0.07 | 0.07 | 0.07 | 0.07 |
| $D_{min}$ after flood | 0.66 | 0.51 | 0.39 | 0.29 | 0.20 | 0.13 | 0.09 |
| Difference | 0.45 | 0.44 | 0.32 | 0.22 | 0.13 | 0.06 | 0.02 |
| $D_{max}$ before flood | 1.50 | 1.72 | 1.58 | 1.60 | 1.61 | 1.46 | 1.45 |
| $D_{max}$ after flood | 1.40 | 1.69 | 1.61 | 1.56 | 1.58 | 1.37 | 1.44 |
| Difference | −0.10 | −0.03 | 0.03 | −0.04 | −0.03 | −0.09 | −0.01 |
| Cesium chloride | | | | | | | |
| $D_{min}$ before flood | 0.42 | 0.40 | 0.39 | 0.29 | 0.19 | 0.23 | 0.23 |
| $D_{min}$ after flood | 0.73 | 0.68 | 0.65 | 0.55 | 0.45 | 0.48 | 0.50 |
| Difference | 0.31 | 0.28 | 0.26 | 0.26 | 0.26 | 0.25 | 0.27 |
| $D_{max}$ before flood | 1.53 | 1.68 | 1.64 | 1.55 | 1.51 | 1.52 | 1.33 |
| $D_{max}$ after flood | 1.54 | 1.68 | 1.65 | 1.52 | 1.54 | 1.48 | 1.53 |
| Difference | 0.01 | 0 | 0.01 | −0.03 | 0.03 | −0.04 | 0.20 |

TABLE 8-continued

| Time at 120° C. (sec.) | 15 | 30 | 45 | 60 | 75 | 90 | 120 |
|---|---|---|---|---|---|---|---|
| Cesium iodide | | | | | | | |
| $D_{min}$ before flood | 0.42 | 0.32 | 0.37 | 0.23 | 0.19 | 0.22 | 0.25 |
| $D_{min}$ after flood | 0.66 | 0.51 | 0.49 | 0.30 | 0.21 | 0.22 | 0.22 |
| Difference | 0.24 | 0.19 | 0.12 | 0.07 | 0.02 | 0 | −0.03 |
| $D_{max}$ before flood | 1.74 | 1.93 | 1.92 | 1.89 | 1.85 | 1.92 | 1.89 |
| $D_{max}$ after flood | 1.76 | 1.91 | 1.92 | 1.91 | 1.87 | 1.90 | 1.96 |
| Difference | 0.02 | −0.02 | 0 | 0.02 | 0.02 | 0.02 | 0.07 |

From the data in Table 8, it will be seen that fixation was achieved with all nucleophiles except cesium chloride. Using cesium iodide, fixation was achieved with a $D_{min}$ of about 0.22, whereas with the other nucleophiles, the fixed $D_{min}$ was about 0.07. Cesium iodide was therefore successful in fixing the intermediate level of density. The rate of fixation was in the order:

CsOBz~CsOPh~CsOH>CsF>CsOAc>CsI>>>CsCl.

Examples 6–7: Reduction Process

Example 6

This Example illustrates a reduction process of the present invention in which a reducing agent precursor (a hydroquinone in its protonated form) is coated in the acid-generating layer and a reagent (in this case an amine) capable of converting this precursor to the reducing reactive material is coated in the color-forming layer, and is mixed by diffusion into the acid-generating layer during the heating step following exposure of the imaging medium.

A stock solution was prepared by dissolving the same superacid precursor as in Example 5 (50 mg), a sensitizer (2,4,6-tris(2,4-dimethoxyphenyl)pyridinium hexafluoroantimonate, prepared as described in the aforementioned U.S. Pat. No. 5,441,850, 50 mg) and the same secondary acid generator as in Examples 4 and 5 (150 mg) in the same polystyrene as in Examples 4 and 5 (2.5 g of a 20% w/w solution in 2-butanone). Coating fluids A–F were prepared by adding to 450 mg aliquots of the stock solution the following quantities of various hydroquinones:

Fluid A: No addition (control)

Fluid B: 2.4 mg of catechol (1,2-dihydroxybenzene)

Fluid C: 2.4 mg of hydroquinone (1,4-dihydroxybenzene)

Fluid D: 3.7 mg of t-butylhydroquinone

Fluid E: 4.9 mg of 2,5-di-t-butylhydroquinone

Fluid F: 3.3 mg of trimethylhydroquinone.

In these coating fluids, the molar ratio of superacid precursor to fixing agent was approximately 1:2.

Coating fluids A–F were coated onto 4 mil Melinex with a #6 coating rod. The resultant films were overcoated with using a #8 coating rod with a dispersion prepared as follows. The same Copikem 35 magenta image dye as in Example 2 (5 g) and an amine base (1-(3-aminoprop-1-yl)imidazole, 0.55 g) were added to a solution of the same polystyrene binder as in the aforementioned stock solution (15 g in 80 g of ethyl acetate), and the resultant solution was added to a solution of the same Vinol 540 poly(vinyl alcohol) as used in Example 2 (57.2 g of a 7% solution in water). Water (110 g) was added, and the resultant mixture was sonicated. Evaporation of ethyl acetate afforded the required aqueous dispersion (154.0 g, 14.5% solids by weight).

The imaging media so produced were exposed through a step wedge to ultraviolet radiation in the same manner as in Example 4. After exposure, the media were heated at 60° C. for 20 seconds, then at 120° C. for 30 seconds. Optical densities (green) were recorded for each exposure level in the same manner as in Example 4, then the media were exposed to fluorescent lights (2000 ft. candles) for 15 minutes, and the optical densities were again recorded in the same manner. Table 9 below shows the results obtained.

TABLE 9

| Exposure (mJ/cm$^2$) | 25.21 | 13.90 | 7.15 | 3.46 | 2.17 | 0.89 | 0 |
|---|---|---|---|---|---|---|---|
| Control (no hydroquinone) | | | | | | | |
| OD before flood | 1.60 | 1.63 | 1.53 | 1.47 | 0.91 | 0.10 | 0.10 |
| OD after flood | 1.59 | 1.69 | 1.62 | 1.50 | 1.05 | 0.27 | 0.27 |
| Difference | −0.01 | 0.06 | 0.09 | 0.03 | 0.14 | 0.17 | 0.17 |
| Cathechol | | | | | | | |
| OD before flood | 1.98 | 1.94 | 1.84 | 1.67 | 1.34 | 0.12 | 0.12 |
| OD after flood | 2.00 | 1.98 | 1.90 | 1.75 | 1.48 | 0.34 | 0.34 |
| Difference | 0.02 | 0.04 | 0.06 | 0.08 | 0.14 | 0.22 | 0.22 |
| Hydroquinone | | | | | | | |
| OD before flood | 2.00 | 1.95 | 1.91 | 1.63 | 1.36 | 0.13 | 0.13 |
| OD after flood | 2.03 | 2.00 | 1.97 | 1.73 | 1.44 | 0.20 | 0.20 |
| Difference | 0.03 | 0.05 | 0.06 | 0.10 | 0.08 | 0.07 | 0.07 |
| 2-t-Butylhydroquinone | | | | | | | |
| OD before flood | 1.92 | 1.86 | 1.73 | 1.53 | 1.02 | 0.15 | 0.15 |
| OD after flood | 1.95 | 1.90 | 1.78 | 1.60 | 1.17 | 0.19 | 0.19 |
| Difference | 0.03 | 0.04 | 0.05 | 0.07 | 0.15 | 0.04 | 0.04 |
| 2,5-Di-t-butylhydroquinone | | | | | | | |
| OD before flood | 1.96 | 1.80 | 1.66 | 1.58 | 1.59 | 0.51 | 0.10 |
| OD after flood | 2.00 | 1.86 | 1.74 | 1.68 | 1.66 | 0.76 | 0.13 |
| Difference | 0.04 | 0.06 | 0.08 | 0.10 | 0.07 | 0.25 | 0.03 |
| Trimethylhydroquinone | | | | | | | |
| OD before flood | 1.94 | 1.90 | 1.86 | 1.71 | 1.35 | 0.11 | 0.11 |
| OD after flood | 2.00 | 1.93 | 1.89 | 1.73 | 1.40 | 0.13 | 0.13 |
| Difference | 0.06 | 0.03 | 0.03 | 0.02 | 0.05 | 0.02 | 0.02 |

From the data in Table 9, it will be seen that the efficiency of $D_{min}$ fixing (zero exposure) was in the order:

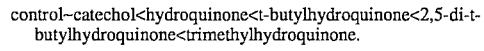

control~catechol<hydroquinone<t-butylhydroquinone<2,5-di-t-butylhydroquinone<trimethylhydroquinone.

Intermediate density levels were generally not fixed in this system, but the sensitivity of the medium was not decreased by incorporation of the hydroquinone into the acid-generating layer.

Example 7

This Example illustrates a reduction process of the present in which a ferrocene derivative is used as the reducing fixing reagent, and also illustrates that the ability of a reducing reagent to function as a fixing reagent in the present process is controlled by the oxidation potential of the reducing reagent.

Coating fluids were prepared as follows:

Fluid A

The same superacid precursor as in Example 5 above (25 mg), and the same sensitizer (25 mg) and secondary acid generator (75 mg) as in Example 4 above were dissolved in a solution of the same polystyrene as in Example 4 (2.5 g of a 10% w/w solution in 2-butanone).

Fluids B0–B4

To separate aliquots of a 16.5% w/w solution of an acrylate polymer, Acryloid B-82 (available from Rohm & Haas, Philadelphia, Pa. 19104) in 2-butanone, 0.184M in the same Copikem 35 image dye as used in Example 3 above, were added sufficient amounts of each of the ferrocene derivatives listed below to make the solutions 0.016M in the ferrocene derivative. The derivatives used were as follows:

| Fluid | Ferrocene derivative | Oxidation potential (mV vs SCE in acetonitrile) |
|---|---|---|
| B0 | None (control) | Not applicable |
| B1 | Ferrocene | 440 |
| B2 | 1,1'-Dimethylferrocene | 340 |
| B3 | 1-Formylferrocene | 720 |
| B4 | Decamethylferrocene | −120 |

An acid-generating layer was prepared by coating Fluid A on to several pieces of a transparent poly(ethylene terephthalate) base of 4 mil (101 μm) thickness using a #8 coating rod. Separately, five color-change layers were prepared by coating Fluids B0–B4 on to 5 mil Melinex base using a #8 coating rod.

The layers so produced were treated as follows:

1. Five pieces of the acid-generating layer were exposed to ultraviolet irradiation in the same way as in Example 1 above (25 mJ/cm² exposure) over half their area. The other half of each piece remained unexposed.

2. The five pieces of acid-generating layer were heated at 60° C. for 30 seconds.

3. Each of the five pieces was laminated to one of the color-change layers B0–B4 at 120° C., 60 psig and 10 ft/min.

4. The transparent base was peeled away from each of the laminated structures.

5. Each of the resultant media was cut into seven portions, each having an exposed and an unexposed region.

6. Each of the seven portions of each of the five media was heated for a different length of time (between 0 and 150 seconds) at 120° C.

7. Green optical densities (in reflection) were recorded for the $D_{min}$ and $D_{max}$ regions of each of the 35 portions in the same manner as in Example 4 above.

8. The 35 portions were exposed to fluorescent light illumination (2000 ft. candles) for 20 minutes.

9. The optical densities in $D_{min}$ and $D_{max}$ regions were again read in the same manner as before.

The results obtained are shown in Table 10 below; the first half of this Table gives optical densities prior to the fluorescent exposure, while the second half gives optical densities after the fluorescent exposure.

TABLE 10

| Time at 120° C. (sec.) | 0 | 15 | 30 | 60 | 90 | 120 | 150 |
|---|---|---|---|---|---|---|---|
| Optical densities before fluorescent exposure | | | | | | | |
| B0, $D_{min}$ | 0.55 | 0.56 | 0.56 | 0.52 | 0.51 | 0.48 | 0.52 |
| B0, $D_{max}$ | 1.47 | 2.42 | 2.34 | 2.20 | 2.15 | 2.07 | 2.37 |
| B1, $D_{min}$ | 0.43 | 0.42 | 0.47 | 0.45 | 0.44 | 0.43 | 0.42 |
| B1, $D_{max}$ | 0.99 | 1.79 | 1.85 | 1.81 | 1.91 | 1.92 | 1.76 |
| B2, $D_{min}$ | 0.49 | 0.49 | 0.51 | 0.44 | 0.45 | 0.50 | 0.49 |
| B2, $D_{max}$ | 1.41 | 1.97 | 1.94 | 1.63 | 1.76 | 1.98 | 2.04 |
| B3, $D_{min}$ | 0.49 | 0.50 | 0.51 | 0.48 | 0.50 | 0.51 | 0.52 |
| B3, $D_{max}$ | 2.15 | 2.15 | 2.19 | 2.17 | 2.02 | 2.06 | 2.15 |
| B4, $D_{min}$ | 0.35 | 0.15 | 0.15 | 0.18 | 0.15 | 0.15 | 0.14 |
| B4, $D_{max}$ | 1.32 | 1.16 | 0.86 | 1.00 | 0.83 | 0.74 | 0.79 |
| Optical densities after fluorescent exposure | | | | | | | |
| B0, $D_{min}$ | — | 1.11 | 1.10 | 1.10 | 1.14 | 1.05 | 1.10 |
| B0, $D_{max}$ | — | 2.44 | 2.30 | 2.21 | 2.18 | 2.19 | 2.40 |
| B1, $D_{min}$ | — | 0.89 | 0.95 | 0.92 | 0.93 | 0.90 | 0.88 |
| B1, $D_{max}$ | — | 1.82 | 1.96 | 1.86 | 1.89 | 2.04 | 1.84 |
| B2, $D_{min}$ | — | 0.98 | 1.01 | 0.88 | 0.91 | 0.97 | 0.93 |
| B2, $D_{max}$ | — | 2.03 | 1.88 | 1.69 | 1.80 | 1.99 | 2.09 |
| B3, $D_{min}$ | — | 0.98 | 1.01 | 0.97 | 1.00 | 0.97 | 0.98 |
| B3, $D_{max}$ | — | 2.09 | 2.21 | 2.20 | 2.10 | 2.08 | 2.14 |
| B4, $D_{min}$ | — | 0.19 | 0.23 | 0.29 | 0.18 | 0.16 | 0.15 |
| B4, $D_{max}$ | — | 1.05 | 0.75 | 0.97 | 0.79 | 0.75 | 0.80 |

From the data in Table 10, it will be seen that only in the case of color-change layer B4, in which decamethylferrocene was present, was fixation of the $D_{min}$ regions achieved, as indicated by the minimal changes in optical density of these regions after the fluorescent exposure, and that a heating time of about 120 seconds at 120° C. was required for adequate fixation.

From the foregoing, it will be seen that the present invention provides an imaging medium, and a process for producing and fixing an image, which produces a final image which is essentially insensitive to radiation of the wavelengths used to produce the image, and which should thus have improved long term storage stability. The reactive material needed for fixing can be chosen so that it can readily be incorporated into the coating solution or dispersion used to form the color-change layer of the imaging medium; thus, the provision of the fixing agent does not require major changes in the manner in which the medium is produced, or the formation of additional layers in the imaging medium.

We claim:

1. A process for producing and fixing an image, which process comprises:

providing an imaging medium comprising an acid-generating layer or phase comprising a mixture of a superacid precursor, a sensitizer and a secondary acid generator, and a color-change layer or phase comprising an image dye;

the sensitizer being capable of absorbing actinic radiation of a sensitizer wavelength which does not, in the absence of the sensitizer, cause decomposition of the superacid precursor to form a first acid;

the secondary acid generator being capable of acid-catalyzed thermal decomposition by the first acid to form a secondary acid; and the image dye undergoing a change in its absorption of radiation upon contact with the secondary acid;

imagewise exposing the medium to actinic radiation of the sensitizer wavelength, thereby causing, in the exposed areas of the acid-generating layer or phase, the sensitizer to decompose at least part of the superacid precursor, the imagewise exposure leading to imagewise formation of the first acid in the acid-generating layer;

thereafter, heating the medium to cause, in the exposed areas of the acid-generating layer or phase, acid-catalyzed thermal decomposition of the secondary acid generator and formation of the secondary acid;

admixing the components of the acid-generating and color-change layers or phases, thereby causing, in the exposed areas of the medium, the secondary acid to bring about the change in absorption of the image dye and thereby form the image;

in at least the non-exposed areas of the medium reacting, with the superacid precursor, a reactive material which irreversibly destroys the superacid precursor, thereby fixing the image.

2. A process according to claim 1 wherein the reactive material is one which undergoes a nucleophilic addition/elimination reaction with the superacid precursor.

3. A process according to claim 2 wherein the superacid precursor is a diaryliodonium salt and the nucleophilic addition/elimination reaction produces an aryl iodide and a product in which an aryl compound is substituted with a residue of a nucleophile derived from the reactive material.

4. A process according to claim 2 wherein the reactive material is a salt of a monovalent metal.

5. A process according to claim 4 wherein the salt has a potassium or cesium cation.

6. A process according to claim 4 wherein the salt has a fluoride, carboxylate, iodide, hydroxide, phenoxide or benzoate anion.

7. A process according to claim 2 wherein the image is a continuous tone image and the nucleophile provided by the reactive material is less basic than the image dye or the anion of the secondary acid.

8. A process according to claim 1 wherein the reactive material effects stoichiometric reduction of the superacid precursor.

9. A process according to claim 8 wherein the superacid precursor is a diaryliodonium salt and the reactive material has a oxidation potential less than about −0.2 Volt, as measured against a standard calomel electrode in acetonitrile solution.

10. A process according to claim 9 wherein the reactive material is selected from the group consisting of:

(i) decamethylferrocene, hydroquinones, catechols, enols, aminophenols, phenylenediamines, hydrazines, hydroxylamines, and pyrazolones;

(ii) salts of transition metals; and (iii) complexes of transition metals.

11. A process according to claim 8 wherein, prior to the imagewise exposure, the reactive material is present in the color-change layer or phase.

12. A process according to claim 8 wherein, prior to the imagewise exposure, a precursor of the reactive material is present in the acid-generating layer or phase, and a reagent capable of converting this precursor to the reactive material is present in the color-change layer or phase.

13. A process according to claim 1 wherein the reactive material comprises a first reactive material which is a nucleophile and a second reactive material which is an oxidation/reduction catalyst.

14. A process according to claim 13 wherein the oxidation/reduction catalyst is a copper compound.

15. A process according to claim 14 wherein the copper compound is a copper(II) salt.

16. A process according to claim 15 wherein the copper(II) salt is any one or more of copper(II) acetate, copper(II) ethylacetoacetate, copper(II) acetylacetonate and copper(II) trifluoroacetylacetonate.

17. A process according to claim 14 wherein the copper compound is copper(I) acetate.

18. A process according to claim 14 wherein, prior to the imagewise exposure, the copper compound is present in the color-change layer or phase.

19. A process according to claim 1 wherein the imagewise exposure causes formation of a protonated product derived from the sensitizer, and the imagewise exposure is followed by a blanket exposure of the imaging medium to actinic radiation of a wavelength different from the sensitizer wavelength, this blanket exposure causing decomposition of additional superacid precursor and the formation of unbuffered superacid in areas exposed during the imagewise exposure, but not causing formation of unbuffered superacid in areas not exposed during the imagewise exposure.

20. A process according to claim 1 wherein the sensitizer has a first form and a second form, the first form having substantially greater substantial absorption at the sensitizer wavelength than the second form, and the imagewise exposure is effected while at least part of the sensitizer is in its first form.

21. A process according to claim 20 wherein, after the imagewise exposure, the whole imaging medium is exposed to radiation of a wavelength different from the sensitizer wavelength, whereby part of the superacid precursor is decomposed to produce superacid and, in exposed areas, the sensitizer becomes doubly protonated, and unbuffered superacid is produced, whereas in non-exposed areas no unbuffered superacid is produced.

22. A process according to claim 1 which is carried out in an essentially anhydrous medium.

23. A process according to claim 1 wherein the acid-generating and color-change layers or phases each comprise a polymeric binder.

24. A process according to claim 1 wherein the superacid precursor comprises an iodonium compound.

25. A process according to claim 1 wherein the iodonium compound comprises a diphenyliodonium compound.

26. A process according to claim 1 wherein the secondary acid generator is an oxalate or a 3,4-disubstituted-cyclobut-3-ene-1,2-dione in which at least one of the 3- and 4-substituents consists of an oxygen atom bonded to the cyclobut-3-ene-1,2-dione ring, and an alkyl or alkylene group, a partially hydrogenated aryl or arylene group, or an aralkyl group bonded to said oxygen atom, said 3,4 disubstituted-cyclobut-3-ene-1,2-dione being capable of decomposing so as to cause replacement of the or each original alkoxy, alkyleneoxy, aryloxy, aryleneoxy or aralkyloxy group of the 3,4-disubstituted-cyclobut-3-ene-1,2-dione with a hydroxyl group, thereby producing squaric acid or an acidic squaric acid derivative having one hydroxyl group.

27. An imaging medium comprising an acid-generating layer or phase comprising a mixture of a superacid precursor, a sensitizer and a secondary acid generator, and a color-change layer or phase comprising an image dye;

the sensitizer being capable of absorbing actinic radiation of a sensitizer wavelength which does not, in the absence of the sensitizer, cause decomposition of the superacid precursor to form a first acid;

the secondary acid generator being capable of acid-catalyzed thermal decomposition by the first acid said secondary acid having an anion to form a secondary acid; and the image dye undergoing a change in its absorption of radiation upon contact with the secondary acid;

the imaging medium further comprising a reactive compound capable of bringing about the irreversible decomposition of the superacid precursor.

28. An imaging medium according to claim 27 wherein the reactive material is capable of undergoing a nucleophilic addition/elimination reaction with the superacid precursor.

29. An imaging medium according to claim 28 wherein the superacid precursor is a diaryliodonium salt and the nucleophilic addition/elimination reaction between the diaryliodonium salt and the reactive material produces an aryl halide and a product in which an aryl compound is substituted with a residue of a nucleophile derived from the reactive material.

30. An imaging medium according to claim 28 wherein the reactive material is a salt of a monovalent metal.

31. An imaging medium according to claim 30 wherein the salt has a potassium or cesium cation.

32. An imaging medium according to claim 30 wherein the salt has a fluoride, carboxylate, iodide, hydroxide, phenoxide or benzoate anion.

33. An imaging medium according to claim 28 wherein the imaging medium, upon imagewise exposure to the actinic radiation, produces a continuous tone image and the nucleophile provided by the reactive material is less basic than the image dye or the anion of the secondary acid.

34. A slide blank comprising:

a support;

a mask layer having a substantially transparent central portion and a non-transparent peripheral portion surrounding the central portion; and, an imageable layer comprising an imaging medium according to claim 28 which is imageable to form an image which can be viewed in transmission, the support, mask layer and imageable layer being secured together so that the support and the imageable layer extend across essentially the entire transparent central portion of the mask layer, at least the portion of the support adjacent the central portion of the mask layer being substantially transparent.

35. A slide blank comprising:

an imageable layer comprising an imaging medium according to claim 28 which is imageable to form an image which can be viewed in transmission, the imageable layer having a pair of surfaces on opposed sides thereof;

a support superposed on one of said surfaces of the imageable layer, at least part of the support being essentially transparent; and a protective layer superposed on the other of said surfaces of the imageable layer, at least part of the protective layer being essentially transparent;

the support, imageable layer and protective layer being secured together to form a slide blank having a thickness of at least about 0.8 mm, and the thickness of the protective layer being such that no part of the imageable layer containing the color-forming composition is more than about 0.2 mm from one external surface of the slide blank.

36. An imaging medium according to claim 27 wherein the reactive material is capable of effecting stoichiometric reduction of the superacid precursor.

37. An imaging medium according to claim 36 wherein the superacid precursor is a diaryliodonium salt and the reactive material has a oxidation potential less than about −0.2 Volt, as measured against a standard calomel electrode in acetonitrile solution.

38. An imaging medium according to claim 36 wherein the reactive material is selected from the group consisting of:

(i) decamethylferrocene, hydroquinones, catechols, enols, aminophenols, phenylenediamines, hydrazines, hydroxylamines, and pyrazolones;

(ii) salts of transition metals; and (iii) complexes of transition metals.

39. An imaging medium according to claim 36 wherein the reactive material is present in the color-change layer or phase.

40. An imaging medium according to claim 36 wherein the reactive material comprises a precursor compound present in the acid-generating layer or phase, and a conversion reagent present in the color-change layer or phase and capable of converting the precursor compound to a species which effects the reduction of the superacid precursor.

41. An imaging medium according to claim 27 wherein the reactive material comprises a first reactive material which is a nucleophile and a second reactive material which is an oxidation/reduction catalyst.

42. An imaging medium according to claim 41 wherein the oxidation/reduction catalyst is a copper compound.

43. An imaging medium according to claim 42 wherein the copper compound is a copper(II) salt.

44. An imaging medium according to claim 43 wherein the copper(II) salt is any one or more of copper(II) acetate, copper(II) ethylacetoacetate, copper(II) acetylacetonate and copper(II) trifluoroacetylacetonate.

45. An imaging medium according to claim 42 wherein the copper compound is copper(I) acetate.

46. An imaging medium according to claim 42 wherein the copper compound is present in the color-change layer or phase.

47. An imaging medium according to claim 27 wherein the sensitizer has a first form and a second form, the first form having substantially greater substantial absorption at the sensitizer wavelength than the second form.

48. An imaging medium according to claim 27 which is essentially anhydrous.

49. An imaging medium according to claim 27 wherein the acid-generating and color-change layers or phases each comprise a polymeric binder.

50. An imaging medium according to claim 27 wherein the superacid precursor comprises an iodonium compound.

51. An imaging medium according to claim 50 wherein the iodonium compound comprises a diphenyliodonium compound.

52. An imaging medium according to claim 27 wherein the secondary acid generator comprises an oxalate or a 3,4-disubstituted-cyclobut-3-ene-1,2-dione in which at least one of the 3- and 4-substituents consists of an oxygen atom bonded to the cyclobut-3-ene-1,2-dione ring, and an alkyl or alkylene group, a partially hydrogenated aryl or arylene group, or an aralkyl group bonded to said oxygen atom, said 3,4-disubstituted-cyclobut-3-ene-1,2-dione being capable of decomposing so as to cause replacement of the or each original alkoxy, alkyleneoxy, aryloxy, aryleneoxy or aralkyloxy group of the 3,4-disubstituted-cyclobut-3-ene-1,2-dione with a hydroxyl group, thereby producing squaric acid or an acidic squaric acid derivative having one hydroxyl group.

53. An imaging medium according to claim 52 wherein the 3,4-disubstituted-cyclobut-3-ene-1,2-dione is selected from the group consisting of:

(a) primary and secondary esters of squaric acid in which the α-carbon atom bears a non-basic cation-stabilizing group;

(b) tertiary esters of squaric acid in which the α-carbon atom does not have an $sp^2$ or sp hybridized carbon atom directly bonded thereto; and (c) tertiary esters of squaric acid in which the α-carbon atom does have an $sp^2$ or sp hybridized carbon atom directly bonded thereto, provided that this $sp^2$ or sp hybridized carbon atom, or at least one of these $sp^2$ or sp hybridized carbon atoms, if more than one such atom is bonded directly to the α-carbon atom, is conjugated with an electron-withdrawing group.

54. An imaging medium according to claim 53 wherein the 3,4-disubstituted-cyclobut-3-ene-1,2-dione is of one of the following formulae:

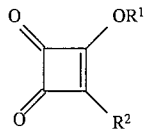
a.

in which $R^1$ is an alkyl group, a partially hydrogenated aromatic group, or an aralkyl group, and $R^2$ is a hydrogen atom or an alkyl, cycloalkyl, aralkyl, aryl, amino, acylamino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer;

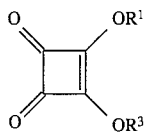
b.

in which $R^1$ and $R^3$ independently are each an alkyl group, a partially hydrogenated aryl group or an aralkyl group, subject to the proviso that either or both of the groups $R^1$ and $R^3$ may be attached to a polymer; and

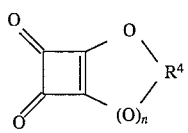
c.

in which n is 0 or 1, and $R^4$ is an alkylene group or a partially hydrogenated arylene group;

or the squaric acid derivative comprises at least one unit of the formula:

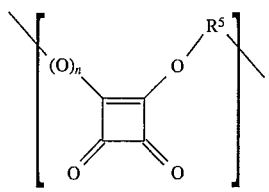

in which n is 0 or 1, and $R^5$ is an alkylene or partially hydrogenated arylene group.

55. An imaging medium according to claim 52 wherein the oxalate is selected from the group consisting of:

(a) primary and secondary esters of oxalic acid in which the α-carbon atom bears a non-basic cation-stabilizing group;

(b) tertiary esters of oxalic acid in which the α-carbon atom does not have an $sp^2$ or sp hybridized carbon atom directly bonded thereto;

(c) tertiary esters of oxalic acid in which the α-carbon atom does have an $sp^2$ or sp hybridized carbon atom directly bonded thereto, provided that this $sp^2$ or sp hybridized carbon atom, or at least one of these $sp^2$ or sp hybridized carbon atoms, if more than one such atom is bonded directly to the α-carbon atom, is conjugated with an electron-withdrawing group;

(d) an ester formed by condensation of two moles of an alcohol with the bis(hemioxalate) of a diol, provided that the ester contains at least one ester grouping of type (a), (b) or (c);

(e) polymeric oxalates derived from polymerization of oxalate esters having an ethylenically unsaturated group, provided that the ester contains at least one ester grouping of type (a), (b) or (c); and (f) condensation polymers of oxalates, provided that the ester contains at least one ester grouping of type (a), (b) or (c) above.

56. A process for fixing an image in an imaging medium, the imaging medium having exposed areas comprising an image dye at least part of which is in protonated form, an acid, and a sensitizer, and non-exposed areas comprising the image dye in unprotonated form, the sensitizer, a superacid precursor and a secondary acid generator, the sensitizer being capable of absorbing actinic radiation of a sensitizer wavelength which does not, in the absence of the sensitizer, cause decomposition of the superacid precursor to form a first acid, and the secondary acid generator being capable of acid-catalyzed thermal decomposition by the first acid to form a secondary acid, the process comprising reacting, with the superacid precursor, in at least the non-exposed areas of the medium, a reactive material which irreversibly destroys the superacid precursor, thereby fixing the image.

\* \* \* \* \*